United States Patent [19]
Greenstein et al.

[11] Patent Number: 5,724,551
[45] Date of Patent: Mar. 3, 1998

[54] METHOD FOR MANAGING I/O BUFFERS IN SHARED STORAGE BY STRUCTURING BUFFER TABLE HAVING ENTRIES INCLUDE STORAGE KEYS FOR CONTROLLING ACCESSES TO THE BUFFERS

[75] Inventors: Paul Gregory Greenstein, Croton-on-Hudson; Richard Roland Guyette, LaGrangeville; John Ted Rodell, Wapplingers Falls, all of N.Y.

[73] Assignee: International Business Machines Corporation, Armonk, N.Y.

[21] Appl. No.: 652,765

[22] Filed: May 23, 1996

[51] Int. Cl.[6] ............................................. G06F 12/14
[52] U.S. Cl. ............................................... 395/491
[58] Field of Search ................... 395/417, 491, 395/250, 270, 448, 451, 403, 410, 472, 474

[56] References Cited

U.S. PATENT DOCUMENTS

| | | | |
|---|---|---|---|
| 3,761,881 | 9/1973 | Anderson et al. | 395/417 |
| 3,761,883 | 9/1973 | Alvarez et al. | 395/491 |
| 3,781,808 | 12/1973 | Ahearn et al. | 395/417 |
| 3,825,903 | 7/1974 | Brown | 395/490 |
| 3,829,840 | 8/1974 | Burk et al. | 395/417 |
| 3,928,857 | 12/1975 | Carter et al. | 395/250 |
| 4,037,214 | 7/1977 | Birney et al. | 395/416 |
| 4,400,770 | 8/1983 | Chan et al. | 395/403 |
| 4,472,790 | 9/1984 | Burk et al. | 395/491 |
| 4,580,217 | 4/1986 | Celio | 395/491 |
| 4,604,688 | 8/1986 | Tone | 395/417 |
| 4,954,982 | 9/1990 | Tateishi et al. | 395/491 |
| 4,999,770 | 3/1991 | Ara et al. | 395/491 |
| 5,163,096 | 11/1992 | Clark et al. | 395/491 |
| 5,193,175 | 3/1993 | Cutts, Jr. et al. | 395/182.09 |
| 5,237,668 | 8/1993 | Blandy et al. | 395/402 |
| 5,335,334 | 8/1994 | Takahashi et al. | 395/491 |
| 5,450,563 | 9/1995 | Gregor | 395/403 |

FOREIGN PATENT DOCUMENTS

| | | |
|---|---|---|
| 56-098766 | 8/1981 | Japan . |
| 57-006952 | 1/1982 | Japan . |
| 61-105656 | 5/1986 | Japan . |
| 2254553 | 10/1990 | Japan . |

OTHER PUBLICATIONS

Capowski, R.S. et al., "Dynamic Address Translator for I/O Channels", IBM Technical Disclosure Bulletin, vol. 23, No. 12, May 1981, pp.5503–5508.

*Primary Examiner*—Moustafa M. Meky
*Attorney, Agent, or Firm*—W. A. Kinnaman, Jr.; B. M. Goldman

[57] ABSTRACT

A program stored on a portable storage medium for transferring the program from/to a data processing system, including to or from a disk medium in the system. The program manages I/O buffers that use I/O storage protection key for protecting storage blocks (page frames) in a shared main storage against unwanted I/O accesses, but the I/O storage keys do not protect the storage blocks from an CP (central processor) accesses. CP key protection may optionally be provided to independently protect the same storage block against unwanted CP accesses. Processes initialize, and address I/O buffers used by I/O programs; each I/O buffer is comprised of a contiguous set of the blocks (page frames). The I/O keys are used independently of any CP keys, and both I/O and CP keys are required for protecting any block against unwanted accesses by both I/O and CP accesses. The I/O keys are supported by a hardware I/O storage key array when real (or absolute) addressing is used by I/O the programs. However, the CP keys may be, but need not be, supported by CP keys in a second hardware key array; since the CP storage keys instead may be supported as virtual CP keys in CP key fields in page table entries (which are used in translating CP virtual addresses to CP real addresses). The separate I/O and CPU storage protection functions may each include any or all of: write protection, read protection, and storage key protection for page frames.

21 Claims, 17 Drawing Sheets

| I/O PROG KEY VALUE 901 | I/O PROT KEY VALUE 902 | ACCESS ALLOWED ? 903 |
|---|---|---|
| ANY | ZERO | NO |
| ZERO | NON-ZERO | YES |
| NON-ZERO<br>NON-ZERO | NON-ZERO<br>NON-ZERO | MATCH=YES<br>NO MATCH=NO |

904 is the first data row; 905 is the second data row.

FIG.9

IOBT 1001

| I/O BUFFER<br>ADDRESS 1002 | I/O BUFFER<br>SIZE 1003 | "IN-USE"<br>INDICATOR 1004 |
|---|---|---|
| . . . . . | . . . . . | . . . . . |
| . . . . . | . . . . . | . . . . . |
| 0 1006 | | |

IOBTE 1005 (for each row)

FIG.10

| IOBT 1001 → | | | | |
|---|---|---|---|---|
| I/O BUFFER ADDRESS 1002 | I/O BUFFER SIZE 1003 | "IN-USE" INDICATOR 1004 | KEY VALUE 1401 | IOBTE -1005 |
| . . . . . . | . . . . . . | . . . . . . | | IOBTE -1005 |
| . . . . . . | . . . . . . | . . . . . . | | IOBTE -1005 |
| 0 1006 | | | | IOBTE -1005 |

FIG. 14

KEY VALUE 1501

| | | |
|---|---|---|
| 1506 — | 00  1502 | I/O NOT PERMITTED |
| 1507 — | 01  1503 | INPUT ONLY |
| 1508 — | 10  1504 | OUTPUT ONLY |
| 1509 — | 11  1505 | INPUT/OUTPUT |

FIG. 15

| | | |
|---|---|---|
| PAGE TABLE ENTRY 0 — CP STRG KEY | PFRA | FLAGS |
| PAGE TABLE ENTRY 1 — CP STRG KEY | PFRA | FLAGS |
| PAGE TABLE ENTRY 2 — CP STRG KEY | PFRA | FLAGS |
| ⋮ | | |
| PAGE TABLE ENTRY N — CP STRG KEY | PFRA | FLAGS |

FIG. 23

METHOD FOR MANAGING I/O BUFFERS IN SHARED STORAGE BY STRUCTURING BUFFER TABLE HAVING ENTRIES INCLUDE STORAGE KEYS FOR CONTROLLING ACCESSES TO THE BUFFERS

FIELD OF THE INVENTION

The present invention relates to novel apparatus that uses unique I/O keys to protect data in a computer memory against unintended access in the operation of I/O programs.

The subject application is related to application Ser. No. 08/652,727, entitled "Method for Managing I/O Storage Keys", filed on the same day as this application and owned by the same assignee and still pending.

PRIOR ART

Key-controlled storage protection was introduced with the IBM S/360 computers in 1964, was used in the IBM S/370 computers, and is now used in IBM S/390 computers. Key-controlled storage protection adds security to a computer system by allowing access to data in a storage block only by programs (CPU and I/O) having the key assigned to the storage block, except for the computer's operating system (OS) which was allowed to access any storage block by using a special key value (e.g. zero key). Any non-OS program (e.g. application program) were only assigned non-zero keys which could only access a block with a matching key, and they were denied access to all data (including instructions) in blocks with keys that mismatched.

In S/360, S/370 and S/390 computers, a four-bit protection key (which had any of 16 values) was respectively assigned to each 2 kilobyte (KB) block in main storage (memory). Each 2 KB block also was assigned a fetch-protection control bit to indicate whether the 2 KB block was fetch protected or not. Fetch protection prevented fetching of any data in the associated data block if its key did not match. The protection key and its associated fetch-protection indicator were together often called a key-in-storage, or just a "storage key", associated with each 2K block of computer memory. Only programs operating in supervisory state (i.e. OS) were allowed to override the key protection in accessing any storage block.

A hardware key array stored the storage key for each respective 2 KB block in the computer's main storage. Each protection key and its associated fetch indicator were stored within a respective byte in the array, and these bytes were indexed to associated 2 KB blocks of main storage. The hardware key array could not be changed by an application program. The key array was changeable only by the use of special supervisory state instructions.

Any storage key in the hardware array was available for use by both CPU and I/O channel programs, while they were actively executing in the computer system. Each CPU program and I/O channel program was assigned a four-bit storage-access key which had its value compared (checked) against the key-in-storage value assigned to an addressed 2K block of storage containing the required data or program to be accessed. When the two key values did not match, alteration of the storage was not allowed by that access. Supervisory state programs (e.g. OS) were assigned a master key (i.e. zero) which enabled them to override the key protection controls.

When IBM S/370 computers were introduced in 1972, a virtual-addressing mode of operation was introduced for CPU programs which used a dynamic-address-translation (DAT) mode, and the key-controlled memory protection was continued for both CPU and I/O programs, as existed before. The virtual memory addresses in CPU programs were treated as virtual addresses and were translated by a two-level table look-up process to produce a real address, that was used for the actual accessing of the computer hardware memory. Virtual memory in S/370 was organized into 2K and 4K blocks, called pages of memory, and mapped via the DAT process onto 2K or 4K, respectively, blocks of real memory, called page frames.

"Blocks" and "page frames" are terms which may be used interchangeably herein when referring to parts of real storage. The IBM S/360, S/370 and S/390 architectures only use a single protection key array in which each key is used by both CPU programs and I/O channel programs. In S/370 and S/390 computers, key-controlled protection is applied to page frames and their real addresses obtained after any CPU address translation of any CPU virtual addresses, and directly to the real addresses provided by their I/O programs. The key protection rules of the earlier S/360 machines were only applied to the real address level, since S/360 did not use address translation.

Over time, virtual memory became more important and the association between key-controlled protection and real memory became more anachronistic. In 1979, IBM introduced the IBM 4300 series of computers that could operate in the Extended Control Program Support: Virtual Storage Extended (ECPS:VSE) mode. In ECPS:VSE mode, all memory addresses used by CPUs and I/O channels were virtual addresses. Address translation is internally controlled by microcode in the computer, that is these address translations were not observable by programs. Special instructions were provided to allow the control program to associate virtual pages and real page frames. Because all addresses used by CPU and I/O channel programs were virtual, key-controlled protection was associated for the first time with virtual memory (i.e. virtual pages), rather than with real memory (i.e. page frames).

The use of ECPS:VSE mode was limited to a single virtual space and so was useful only in relatively small computers. Large IBM computers now use multiple virtual spaces with the S/370 dynamic address translation (DAT) mode and its S/390 follow-ons, and key-controlled protection continues to be associated only with real memory page frames whether or not virtual addressing is used by any CPU program therein.

An S/370-like DAT mode was disclosed in a Japanese Application No. 59-225686 of Tatsuro Hashiguchi, entitled INFORMATION PROCESSING UNIT, filed Oct. 29, 1984, which shows a table of key-in-storage values associated with a page-translation table used by DAT in which each element in Hashiguchi's storage-key table corresponds to an element in a page-translation table, thereby associating a key-in-storage value with each virtual page. One problem with the Hashiguchi teaching is that it abandons memory protection for I/O channel programs when used in S/370 computer systems, because S/370 did not use DAT for I/O channel programs. In S/370, I/O channel programs use real addresses exclusively and therefore had no way to use the Hashiguchi storage-key table.

No I/O channel program can used Hashiguchi's page entry keys in an IBM S/370 or S/390 system environment (where they can only be used by CPU programs), because they do not use DAT for channel programs. Therefore Hashiguchi's PT storage-key values cannot protect against the unintended alteration of main storage by real addressing I/O programs in the S/370 and S/390 environments.

None of the known prior art provides complete protection against alteration of the main memory of a computer system against wild I/O stores. All known prior art which use storage protection keys for I/O programs also use the SAME protection key for CPU programs, and this results in a storage protection defect of enabling an I/O store to occur in any part of main memory accessed by using the same key for a CPU program.

Thus with prior protection key schemes, only one key value is assigned to any storage block, and it is not practical to change the key assignment between CPU and I/O uses of a block because of a resulting large switching overhead. Thus concurrent accesses by CPU and I/O programs to the same storage block cannot be prevented in such prior art methods.

Thus, no known prior art provides a storage key protection mechanism that operates differently for I/O channel programs than for CPU programs, which can separately protect a storage area being used by any CPU from wild stores by an I/O program—which cannot be done in a system allowing the I/O programs to use the same keys as CPU programs.

In the different prior art of "page fixing", it should be understood that page fixing does not protect storage from alteration by either I/O or CPU program accesses. Page-fixing is only used for preventing page frame contents from being paging out to DASD storage.

SUMMARY OF THE INVENTION

In computer systems as they exist today, there is no convenient way of determining if a system failure is caused by unwanted I/O stores into a memory area used by a CPU program. The subject invention prevents I/O stores from being a cause of such failures by not allowing I/O stores into areas of memory not being used for I/O data transfers.

It is therefore a primary object of this invention to provide a mechanism for protecting memory content from unwanted alteration by I/O program accesses that would change data therein, without affecting alteration of that data by CPU accesses. That is, this invention only protects memory blocks from unwanted I/O program accesses.

It is hence an object of this invention to protect storage pages from I/O accesses, without protecting these pages from any CPU program accesses. A separate CPU protection mechanism must be used if memory blocks are to be protected against unwanted CPU accesses. Therefore, this invention protects memory pages from I/O data being transferred into, or out of, any memory page in main storage.

This invention has discovered that having I/O protection keys separate from CPU protection keys provides greater storage protection than can be obtained by use of a single key providing both I/O and CPU protection.

The invention provides a separate and dedicated I/O protection key hardware array to protect page frames (blocks) not assigned for I/O accessing against unwanted I/O-program accesses. An I/O protection hardware array contains an I/O protection key for each page frame in main storage. If CPU protection is required, it may be supported by another hardware array containing a CPU storage key, for each page frame in main storage (which are considered real keys), or by keys in CPU page tables (which are considered virtual keys).

This invention, in combination with a CPU protection key hardware array, therefore adds the following two protection conditions: 1) CPU program accesses and no I/O program accesses, and 2) I/O program accesses and no CPU program accesses. These protection conditions were not available with the prior art's combined I/O and CPU protection key, which could only provided the following two protection conditions: 3) both CPU program and I/O program accesses, 4) neither CPU program nor I/O program accesses.

Thus this invention, in combination with a CPU protection key hardware array, can provide any of the following four protection condition in a page frame: 1) both CPU program and I/O program accesses, 2) neither CPU program nor I/O program accesses, 3) CPU program accesses and no I/O program accesses, and 4) I/O program accesses and no CPU program accesses. The prior type of combined CPU and I/O protection key only provided for two protection conditions: 1) both CPU program and I/O program accesses, 2) neither CPU program nor I/O program accesses; but it could not provide for 3) CPU program accesses and no I/O program accesses, or 4) I/O program accesses and no CPU program accesses.

If this invention is added to a conventional S/370 or S/390 storage protection mechanism to protect its main storage against unwanted I/O program accesses, then its conventional storage key array operations must be restricted to only CPU-program storage accesses.

Thus, the use of CPU protection is optional in so far as this I/O protection invention is concerned, although CPU protection may be mandatory in a particular computer design. If the two key arrays are provided, they work together to provide greater key protection than is provided by any type of key protection found in the prior art. Although a page frame is protected against I/O accesses, Thus, the I/O protection array may, or may not, be used in combination with a separate CPU protection array for protecting against unwanted accesses by CPU programs, and these two types of arrays operate separately and independently of each other for protecting memory page frames from CPU and I/O program accesses. When this invention is used without CPU keys, the I/O key array protects against only the I/O programs accessing pages which are not allowed to be accessed by I/O programs.

One preferred hardware embodiment has the non-obvious object of reducing the cost Of computer systems having both I/O and CPU key protection. It does this by using a single simplified hardware key array as an I/O real key protection array. The CPU keys do not use any hardware array (and do not have the accompanying cost), because they are provided in low-cost main storage as virtual page table entries in random access storage. The I/O and CPU access protection functions separately use their respective keys. Each page frame (block) in the storage is associated with both an I/O real key and a CPU virtual key, which may control the following access functions: block write protection and block read protection. These key arrays operate independently of each other in controlling access by I/O and CPU programs to any memory page (block); and they are coordinated by the computer's operating system which initially sets them in preparation for their use in computer operations.

A method of operation for using this invention is to set all I/O and CPU protection keys to a "no access allowed" state. Then the I/O protection mechanism may selectively set each I/O key to an "access allowed" state whenever the associated page frame is to be accessed by an I/O program; and the I/O key is reset to an "access denied" state whenever the I/O program has ended its access to the associated page frame. CPU programs may be allowed to access a block while it is being accessed by an I/O program, so that both the block's CPU key and its I/O key may be set to an "access allowed" state during I/O access allowance state, with only the I/O program access allowed state ending when the I/O program ends.

In a preferred method of operation, whenever a page frame is to be accessed by an CPU program, the I/O key may be set to a "no access allowed" state, and the CPU key may be set to an "access allowed" state.

Each I/O storage key in an I/O key array may be comprised of as little as a single bit for each block (page frame) in the main storage. If a single bit is used as an I/O storage key, its setting controls an I/O disabled "no access allowed" state and an I/O enabled "access allowed" state for an associated memory block.

Further in another embodiment, two-bit I/O storage keys may be used to provide not only the I/O enabled and the I/O disabled states provided by the one-bit keys, but also restrict the direction of data movement for a storage block assigned the storage key. That is, the two-bit key also defines an input-only block, an output-only block, an input and output block, and a no-access-allowed state for a block which cannot have either input or output.

In a still further embodiment, each I/O storage key in an I/O key array may be comprised of a matchable key value for prohibiting accesses by an I/O program to an associated memory block unless the I/O program is using an I/O program key matching the block's currently assigned storage key.

However in the embodiments using the one-bit or two-bit I/O storage key described in the preceding paragraphs, this invention does not require use of any I/O program key and no key match is involved in determining if an access is allowed. But an I/O program key must be used in the embodiment where an I/O storage key has a matchable storage key.

In a further embodiment, a one-bit or two-bit key I/O storage key may combine with a matchable key of the type described above to provide a combined storage key. An I/O program key must be used with such combined storage key for matching the matchable part of each I/O storage key. But the one-bit or two-bit key part of such combined storage key does not require any matching part in the combined I/O program key, since such one or two bit part performs its control functions without any key matching operation. Nevertheless, the one-bit or two bit key may optionally be contained in the I/O program key and be matched with its corresponding part of the I/O storage key as an additional check on the correctness of this key part, since if they mismatch this portion of either the I/O program key or I/O storage key is in error and no access of the block should be allowed.

In this manner, the operation of the subject I/O storage protection array differs from the prior S/360, S/370, and S/390 key-controlled storage protection arrays. The most fundamental difference is that these prior systems used the same storage protection array key for protecting against both CPU and I/O channel program accesses in any storage block, but cannot protect between CPU and I/O accesses; while in the present invention the I/O protection array is used exclusively for protecting memory against unwanted I/O channel program accesses. This distinction provides the non-obvious implication of protecting a page frame being used by a CPU program from being altered, or accessed, by an I/O access; and this distinct kind of protection is not provided by any of these prior dual protection-key concepts. In the environment of the present invention, CPU programs and I/O programs do not use the same storage protection key.

BRIEF DESCRIPTION OF THE DRAWINGS

The detailed description includes preferred embodiments of the invention, together with advantages and features, by way of example with reference to the following drawings.

FIG. 3B illustrates a page table entry containing a CPU storage key used to provide storage protection for a virtual storage page addressed by a CPU.

FIG. 9 shows a table that summarizes the access operations of the I/O keys containing match fields in an I/O storage protection array, such as shown in FIG. 6.

FIG. 10 shows an I/O buffer management structure used by a system control program (SCP) to manage its I/O buffers.

FIG. 14 shows an I/O buffer management structure used by an SCP to manage I/O buffers, including the key values, buffer use controls, and locations of associated I/O buffers.

FIG. 15 shows possible values of a two-bit key value field in the I/O buffer management table used as indicators of I/O buffer usage.

FIG. 23 is a page table showing the central processor storage keys within the page table entries.

DETAILED DESCRIPTION OF THE INVENTION

Figure 1:
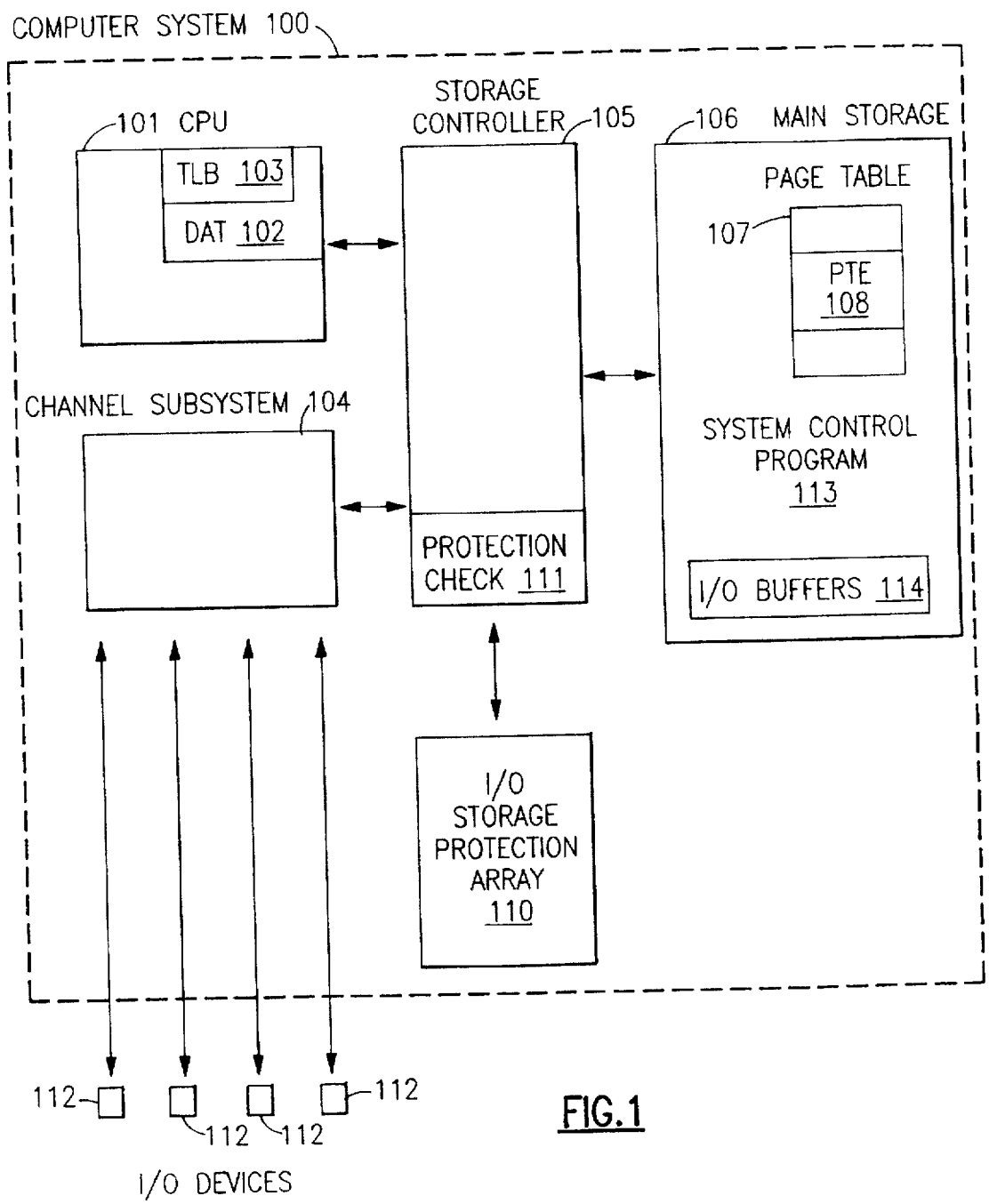
FIG. 1 is an overall system diagram showing important components in a system having an I/O storage protection key array for use with I/O programs and without any CPU storage protection keys being supported.

FIG. 1 is a diagram of a computer system 100 containing the subject invention. System 100 includes one or more central processing units (CPUs) 101 for processing CPU programs, a channel subsystem 104 containing I/O processors and channel processors for processing I/O programs (channel programs), a main storage (memory) 106 for storing programs and data, an I/O protection array 110 for storing I/O program protection keys, and a storage controller 105 for interconnecting the CPUs, I/O subsystem, and array 110 to the main storage 106 for controlling accesses therein. The I/O protection array 110 contains an I/O protection key for each page frame in the main storage 106.

Each I/O key has a size which differs in different embodiments disclosed herein, such as ranging from a single bit per I/O key to a byte per I/O key. When the I/O key is a single bit, its contained I/O information either allows or prevents access to an associated page of main memory. When the I/O key size is greater than a single bit, its contained I/O information increases, as is described in subsequently disclosed embodiments of this invention.

Each CPU 101 in the preferred embodiment contains a dynamic address translation (DAT) facility 102 and a translation-lookaside buffer (TLB) 103 that is used by the DAT facility 102. The operation of CPUs and DAT are well known to those skilled in the art, in which the key associated with a currently used page is copied into an entry in the TLB from which key checking is done. Alternatively, the key may be copied into an entry in the CPU's private cache.

However, it should be understood that the subject invention is also usable in a computer system only using real addressing (no DAT), but that is not the preferred embodiment.

The main storage 106 contains a system control program 113 (SCP), such as the IBM Multiple Virtual Storage/ Enterprise System Architecture (MVS/ESA), which executes on S/390 CPUs that also include support for executing I/O channel programs and their data which is processed in the computer system. SCP 113 in main storage 106 also contains system control information, such as one or more page-translation tables 107 having entries 108 that contain the page-frame real address (PFRAs) used for translating virtual page addresses to page frame real addresses (PFRAs) in entries of the page-tables. The use of page-translation tables by DAT facilities are well known to those skilled in the art.

The I/O (channel) subsystem 104 is controlled by I/O instructions (called command control words, CCWs), issued by the SCP 113 operating in any CPU 101, which initiates the I/O functions. The channel subsystem 104 performs the data input and output functions in computer system 100 under the control of I/O programs stored in the main storage 106 that direct the transfer of data between various I/O devices 112 connected through I/O channels to main storage 106.

Storage controller 105 controls the transfer of data between main storage 106 and any CPU 101, and also between main storage 106 and I/O channel subsystem 104. The storage controller 105 also has a protection check feature 111 which the initialization of protection information in array 110 under the control of any CPU 101. The storage controller 105 accesses the keys in I/O protection array 110 when performing the I/O-access protection-checking function and then uses a protection check feature 111 which checks for violations in the logic rules for I/O key use in the normal operation of the system.

SCP 113 designates certain areas of main storage it controls for use as I/O buffers 114. These storage areas are reserved by SCP 113 as targets for input from I/O devices 112, and output to I/O devices 112. The storage occupied by the I/O buffers 114 is page-fixed by the SCP to prevent data in the pages from being paged out while I/O is being performed to or from them.

FIG. 10 depicts an I/O buffer management table (IOBT) 1001 maintained by SCP 113. IOBT 1001 contains a number of entries (IOBTE) 1005 that respectively correspond to the I/O buffers 114 usable by the SCP for I/O data transfer between an I/O device and the main memory of the computer system. Each IOBTE 1005 contains a virtual address in a field 1002 of an associated I/O buffer also located in the main memory of the computer system. Each of the associated I/O buffers comprises a contiguous range of virtual storage.

Each IOBTE 1005 in FIG. 10 has three fields: I/O buffer address field 1002 pointing to an associated I/O buffer 114, an I/O buffer size indicator field 1003 indicating the amount of storage in the associated I/O buffer 114 as an integer number of contiguous page frames in the main memory, and an "in use" indicator field 1004 that may be a bit initially set to zero to indicate the buffer is not-in use. When the associated I/O buffer is allowed to be used to perform I/O, field 1004 is set to one. A zero value in the I/O buffer address field 1002 indicates it has no allocated associated I/O buffer. (Although the preferred embodiment depicts the associated I/O buffer as being a contiguous set of page frames in memory, any number of different types of data allocation structures may be used with IOBT 1001, such as a linked list, a heap, or any other convenient data structure.)

I/O protection array 110 contains n storage keys, where n represents the number of page frames in main storage 106, which generally is less than the number of IOBTEs in table 1001 in FIG. 10 since any I/O buffer may be comprised of more than one page frame. That is, each I/O buffer is a contiguous set of virtual pages which are mapped by address translation into non-contiguous page frames which may be anywhere in main storage.

One Bit I/O Keys

Figure 4:
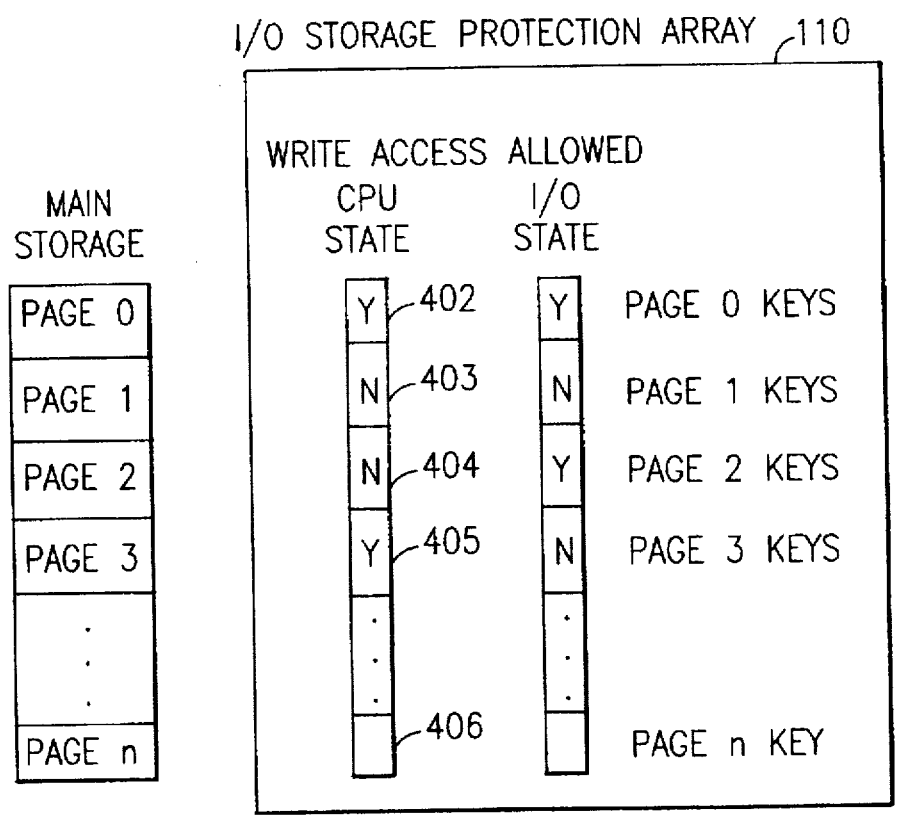
FIGS. 4 and 4A show schematically the I/O protection array in FIGS. 1, 2 and 3 in which each key is comprised of a single bit.

The minimum size of each I/O storage key in the I/O storage protection array is one bit. Such an array is shown schematically in FIG. 4, in which each of the entries 402–405 in the I/O protection array 110 is said to be a memory-alteration-control bit for a corresponding page frame in main storage (memory) 106. When the bit comprising a key in the I/O protection array has a zero value, alteration is not permitted in the corresponding page frame—and the storage controller prevents I/O data from being transferred into the associated I/O buffer by the I/O channel subsystem 104. When the key bit has a one value, alteration is permitted in the associated I/O buffer and then an I/O data transfer may be performed to or from it.

Figure 19:
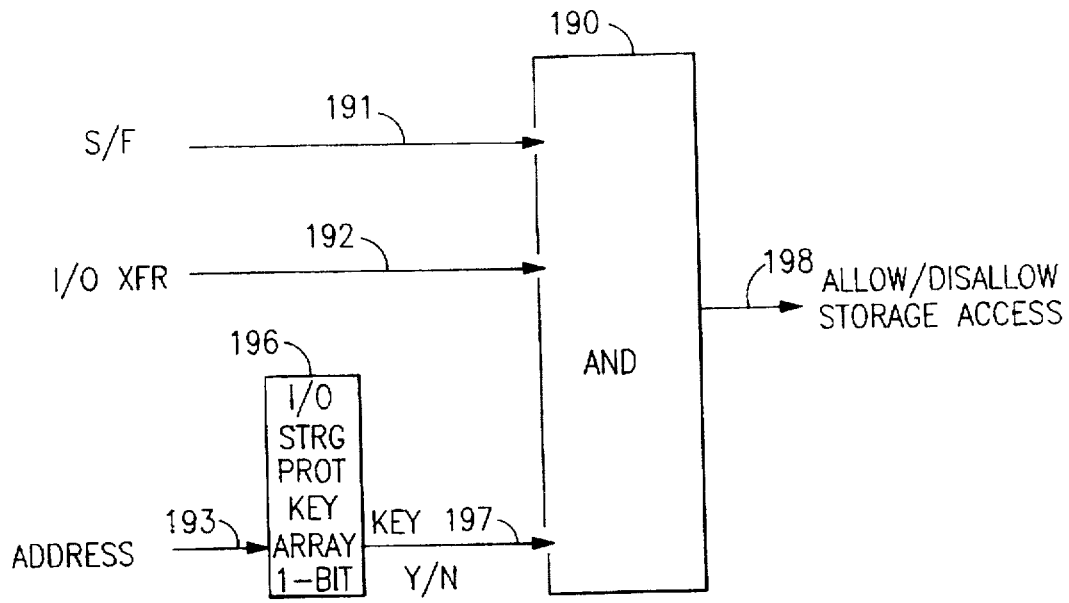
FIG. 19 shows hardware logic usable with one-bit I/O storage keys.

FIG. 19 represents hardware logic circuits that control allowance or disallowance of a storage access for a request by an I/O program for fetching or storing memory data protected by a one-bit type of I/O storage key array 196.

Signal lines 191, 192 and 197 are provided as inputs to an AND gate 190. They include store/fetch (S/F) signal line 191 and an I/O transfer signal line 192. An address bus 193 is provided to a storage key array 196 containing one-bit storage keys. The address on bus 193 locates the required one-bit I/O storage key in array 196, and the key is outputted on line 197 as a one bit value representing a yes/no (Y/N) signal presented to AND gate 190 along with input lines 191 and 192. The ANDing of the signals on lines 191, 192 and 197 generates an allow/disallow storage access signal on the gate output line 198.

Figure 11:
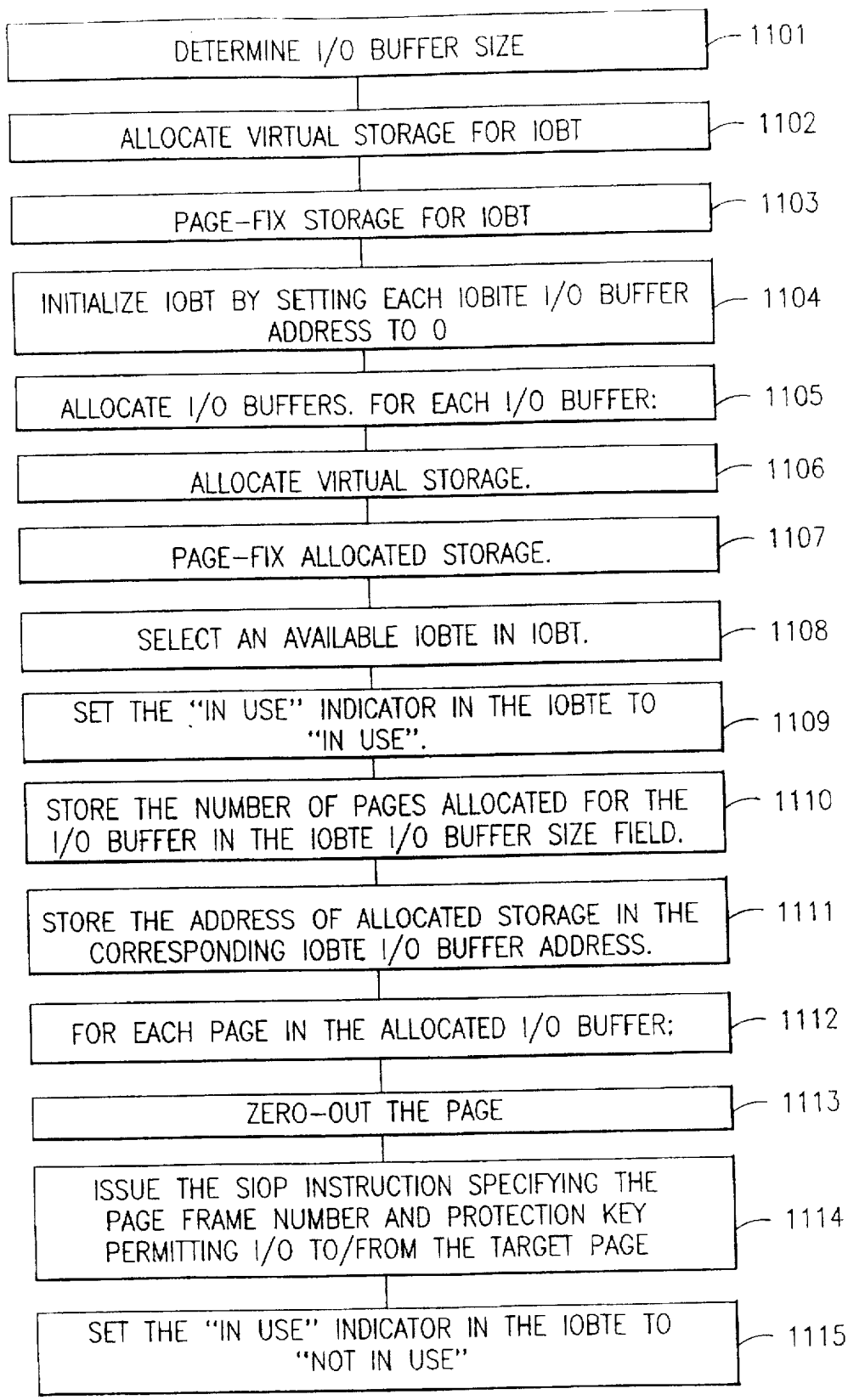
FIG. 11 shows an I/O buffer allocation process used during an SCP initial program load (IPL).

FIG. 11 is a flow diagram of steps in a system initialization process that includes loading the I/O key array from fields 1401 in an IOBT 1001. Process step 1101 determines the required I/O buffer size, step 1102 allocates the virtual storage for the IOBT 1001, step 1103 fixes the page frames containing IOBT 1001 which prevents the IOBT from being paged out. Then, step 1004 initializes the allocated IOBT space by setting the I/O buffer address value in each IOBTE to zero. Next steps 1105, 1106 and 1107 allocate required I/O buffers, memory space for the required I/O buffers, and fixes their page frames in the memory.

Then, step 1108 selects an available IOBT entry for each allocated I/O buffer. Step 1009 sets the "in use" indicators 1004 to one to indicate the "in-use" state for the associated I/O buffer, so that the following steps 1110–1113 can be performed in the I/O buffers. Step 1110 sores the number of pages allocated for the associated I/O buffer into the IOBTE I/O buffer size field 1003, and step 1111 stores the I/O buffer virtual address in the corresponding IOBTE I/O buffer address field 1002. Step 1112 accesses each page in the associated I/O buffer and step 113 zeros out the content of each page.

Finally, step 1114 sets up and executes a SIOP instruction (shown in FIG. 7) to load key values into the I/O key array 110. If an IOBT having the structure in FIG. 10 is used, the SCP will need to insert the required key values into the R2 operand of the SIOP instruction according to its determined values needed for the keys. However, if the IOBT has the structure in FIG. 14 (containing key values in fields 1401), the SCP can insert the required key values from fields 1401 into the R2 operand of the SIOP instruction to correctly load the I/O key array 110. In this manner all of the I/O keys are initialized. Then step 115 completes this initialization process by turning off (setting to zero) the target IOBTE's "in use" indicator field 1004, so that the IOTBE indicates that the associated I/O buffer is available but not in use.

Figure 12:
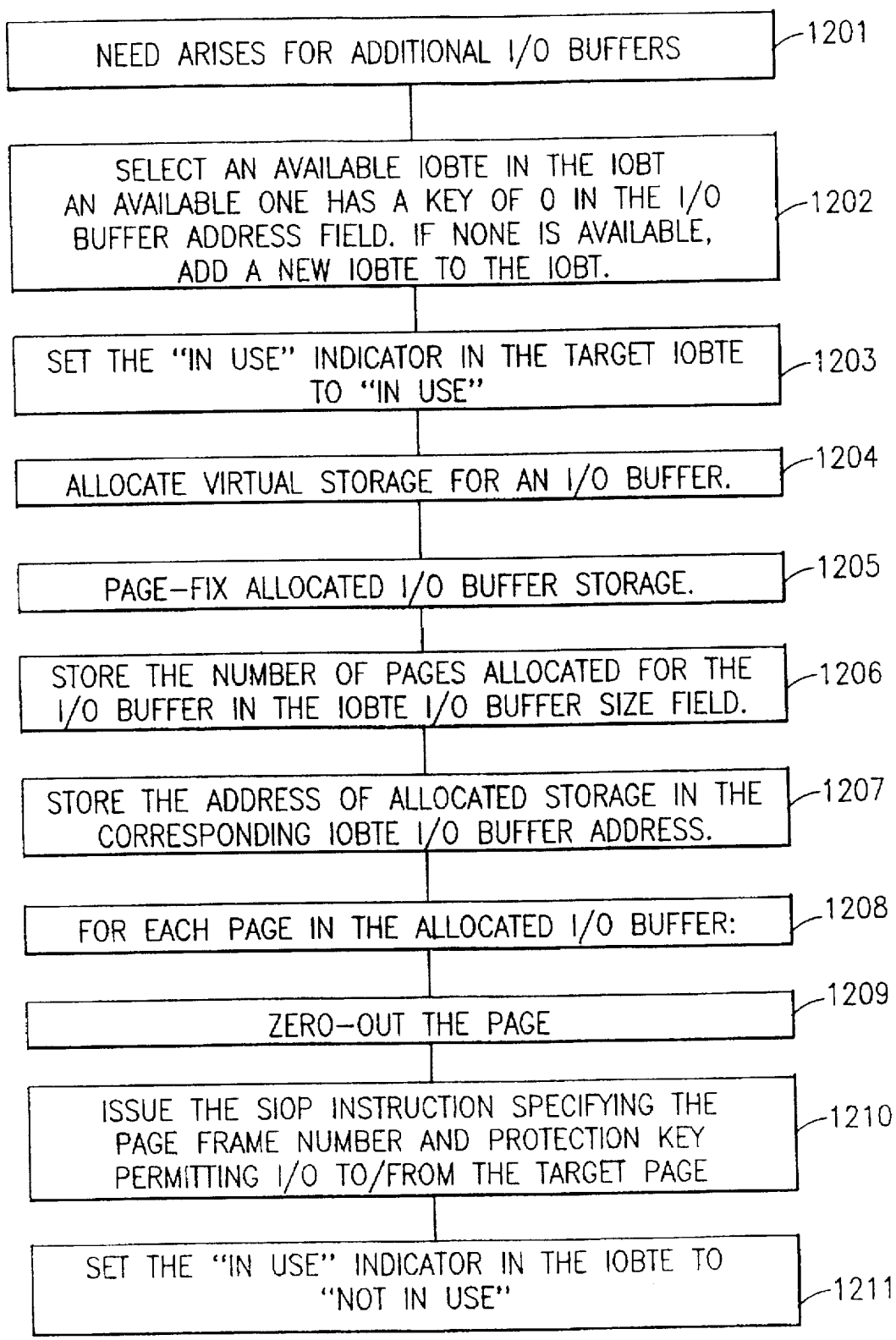
FIG. 12 shows a process for adding additional I/O buffers.

After initialization is complete, the SCP can put the allocated I/O buffers into operation, and it can later add more I/O buffer space whenever required in the use of the computer system. FIG. 12 shows a process for later addition of I/O buffers when such a need arises as is indicated by step 1201. Step 1202 selects an available IOBTE in the IOBT (i.e. indicated by a zero value in its I/O buffer address field 1002). If an available entry is not found, step 1202 creates an IOBTE and added it to the IOBT.

Then, step 1203 sets the "in use" indicator field in the target IOBTE to indicate that the IOBTE is in use to enable those of the following steps which operate on the I/O buffer content. Step 1204 allocates the necessary amount of virtual memory for the new I/O buffer, and step 1205 fixes the page frames in the associated I/O buffer to prevent them from being paged out of memory. Then step 1206 stores the number of pages allocated for the I/O buffer into the IOBTE field 1003 containing the corresponding I/O buffer size value, and step 1207 stores the I/O buffer address into the IOBTE I/O buffer address field 1002. Then step 1208 accesses the I/O buffer and step 1209 zeros each of its page frames. Step 1210 issues the SIOP instruction 701 specifying the associated key value to load into the I/O key array 110. The process completes with step 1211 setting the "in use" indicator to the "not in use" state in the IOBTE for the newly created. I/O buffer.

Figure 13:
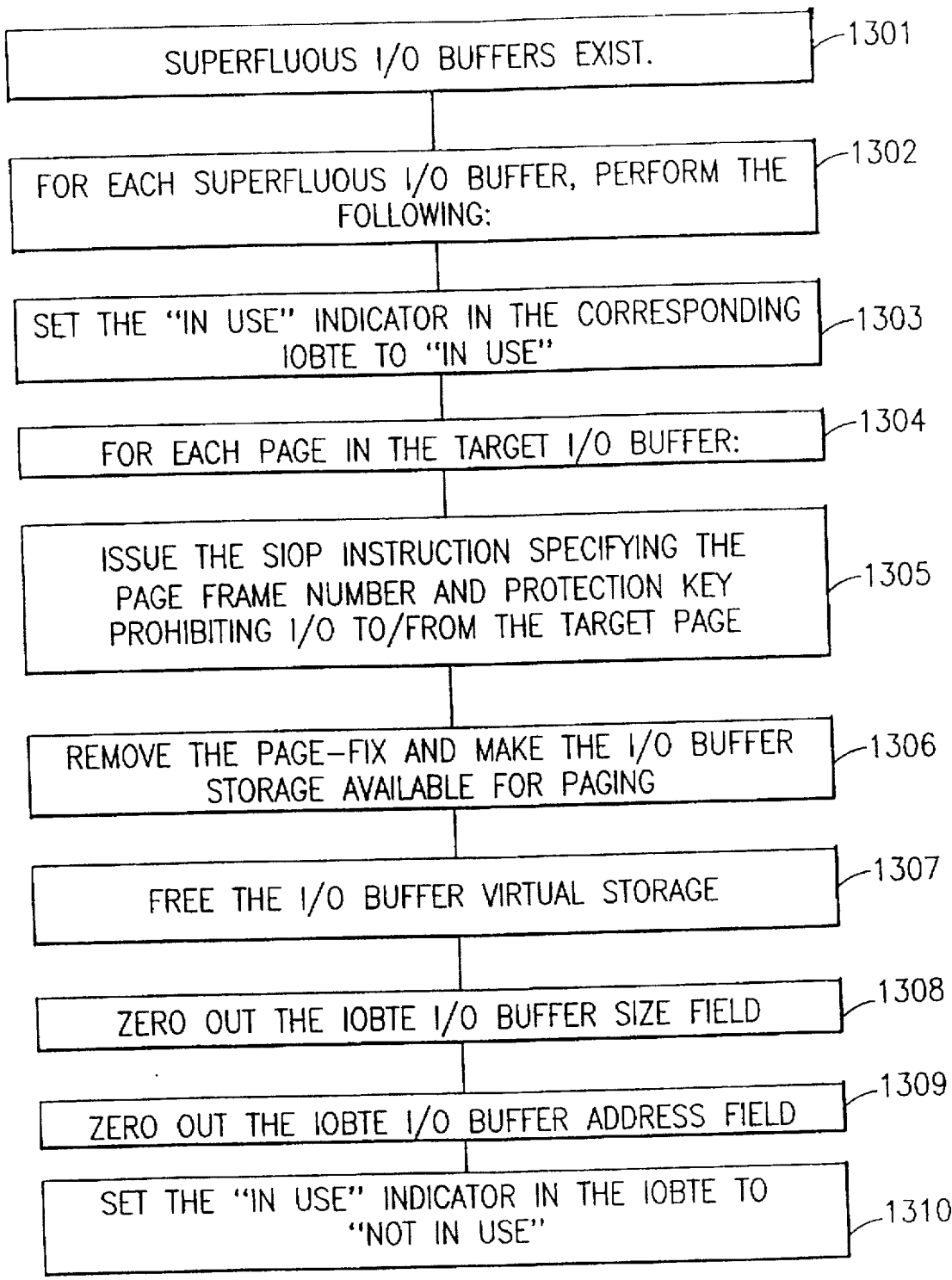
FIG. 13 shows a process for removing superfluous I/O buffers.

Similarly, when an existing I/O buffer is no longer needed, it may be removed from use. FIG. 13 shows a process for removal of a superfluous I/O buffer. Step 1301 determines when one or more I/O buffers are determined to be superfluous, and for each superfluous I/O buffer, the following steps are performed by entering step 1302: Step 1303 sets the "in use" indicator in the corresponding IOBTE to allow manipulation of the contents of the associated I/O buffer. Then step 1304 enters each page in the target I/O buffer, and step 1305 issues the SIOP instruction 701, which locates an associated key in key array 110 by the page frame number in operand R1, and loads zeros from operand R2 into the array's corresponding protection key to zero it and thereby prohibit the usage of the target page by I/O. Then step 1306 removes the page-fix state from the target I/O buffer, and step 1307 frees (deallocates) the I/O buffer virtual storage. Then steps 1308 and 1309 zero out the corresponding IOBTE I/O buffer size field and the IOBTE I/O buffer address field. Finally, step 1310 sets the "in use" indicator in the target IOBTE to the "not in use" state, thus completing the process.

Two Bit I/O Keys

Figure 5:
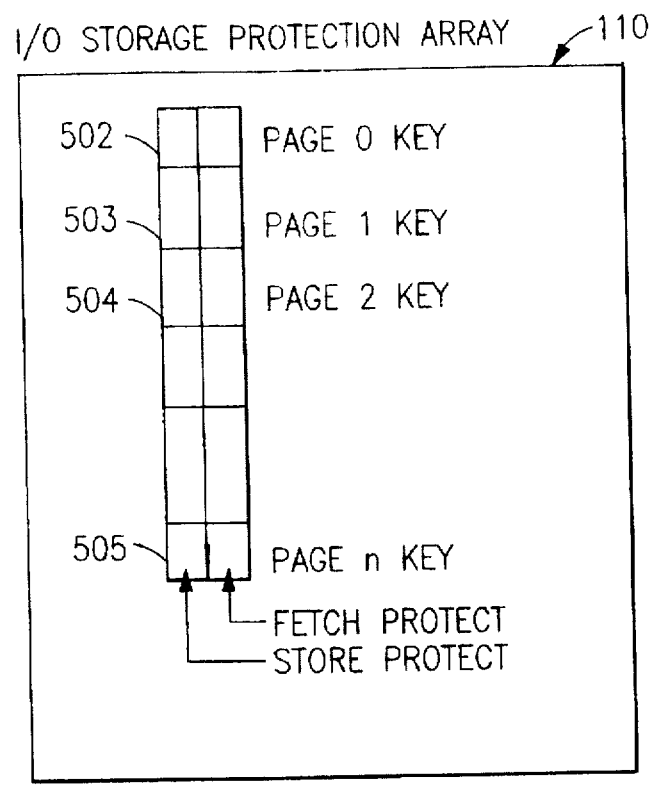
FIG. 5 shows schematically the I/O protection array in FIGS. 1, 2 and 3 in which each key is comprised of two bits.

The operation of the I/O protection array 110 is enhanced by providing two bits instead of one bit for each key in I/O protection array 110. FIG. 5 shows such an I/O protection array, wherein the two bits enable it to control the direction of data flow for an I/O buffer. One of the two bits in each of key 502–505 is a store protect bit which prevents alteration of the associated I/O buffer in main storage 106 (as described in regard to the single bit key in FIG. 4), while the second bit is a fetch protect bit which protects the associated I/O buffer against fetching data from it by any I/O program. Thus, when the store protect bit has a zero value, the channel subsystem 104 is prevented by storage controller 105 from storing data into the associated I/O buffer in main storage 106, and when the fetch protect bit has a zero value, the channel subsystem 104 is prevented by storage controller 105 from fetching data from the associated page frame in main storage 106. A zero value for both the store and fetch protect bits prevents any I/O program from using (either storing or fetching) in the associated I/O buffer.

Figure 8:
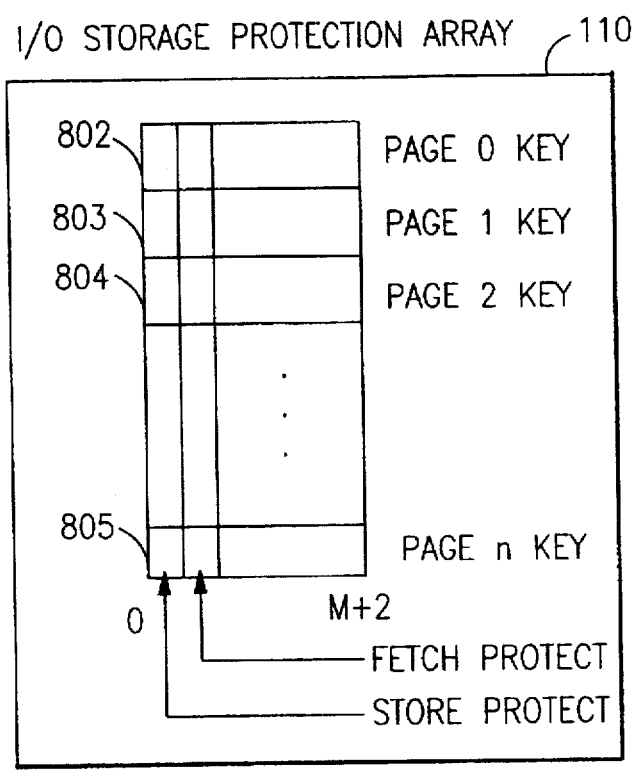
FIG. 8 shows schematically the I/O protection array having m+2 bits per key, including a fetch protect bit and a store protect bit.

The I/O storage protection key array shown schematically in FIG. 8 adds two bits in each I/O storage protection key 802–805 to specify the type of storage access allowed—the remaining of the m-bits are matched with the m bits of the I/O channel program key, following the matching rules previously explained. When the keys do not match, all accesses by the I/O channel program are prohibited. The two bit in FIG. 8 are similar to the two bits in the two-bit array of FIG. 5.

The protection check feature 111 of storage controller 105 contains the I/O key operation logic described herein to enforce the I/O key rules. In this manner, the invention enables the SCP to obtain and use different degrees of protection over use of the I/O buffers, including protection from data movement in an undesired direction of data movement to/from the respective I/O buffer, which can characterize each of the I/O buffers as an input-only buffer, an output-only buffer, or a dual-movement I/O buffer allowed both input and output.

FIG. 15 shows a table of values for two bit keys, in which a value of 11 indicates that no I/O is permitted into the associated buffer 114. Note that the 00 value appears in the key value field 1401 in FIG. 14, which it is used only while the associated I/O buffer is being initialized or removed from the system. During normal operation of the I/O buffers with I/O programs, the key value in the I/O key array is the only key value used in the system. During normal use, this key in array 110 always has a non-zero value, which is one of the three values, 01, 10, 11 that permit some manner of I/O program use of the buffer. The 01 value indicates that the associated buffer is to be used only for input, but not for output. The 10 value indicates that the buffer is to be used only for output, but not for input. The value of 11 value permits the buffer to be used for both input and output.

Figure 20:
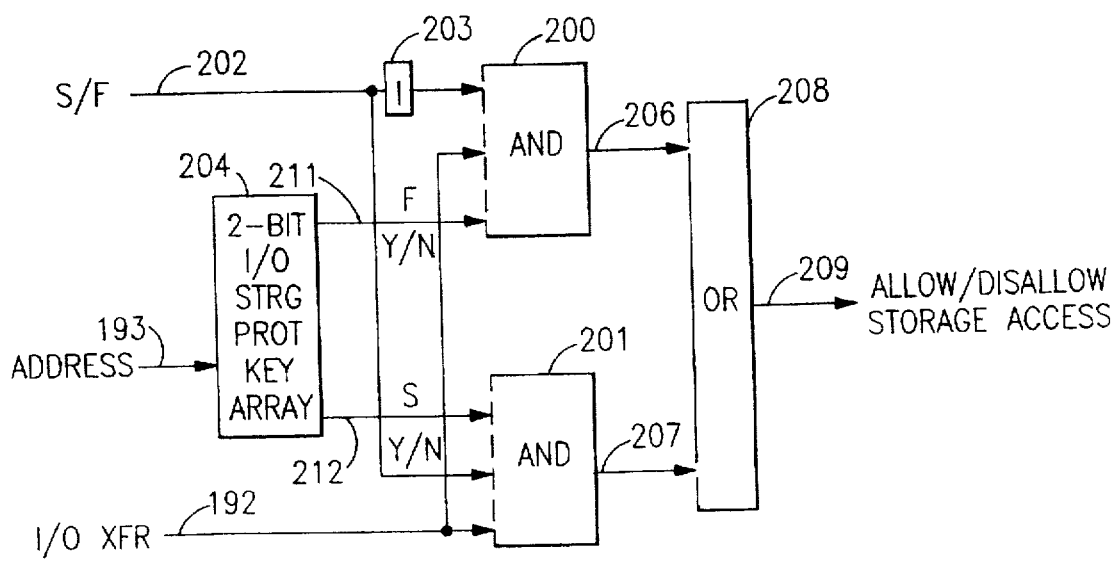
FIG. 20 shows hardware logic usable with two-bit I/O storage keys.

FIG. 20 represents hardware logic circuits that control allowance or disallowance of a storage access for a request by an I/O program for fetching or storing memory data protected by a two-bit type of I/O storage key array 204. I/O transfer signal line 192 and address bus 193 are included as inputs. Storage key array 196 contains two-bit storage keys. The address on bus 193 locates the required two-bit I/O storage key in array 204, and the two bits of the key are outputted on lines 211 and 212 and presented as inputs to AND gates 206 and 207, which also receive the I/O transfer signal on line 192. The S/F signal on line 202 is inputed to gate 201, but is inverted in inverter 203 before being provided as an input to gate 200. Outputs of the signals on lines 206 and 207 are provided to an OR circuit 208 to generate an allow/disallow storage access signal on the gate output line 209. Gate 200 generates a disallowance output signal for an I/O fetch signal when the first bit of the two-bit key is set to a one state. Gate 201 generates a disallowance output signal for an I/O store signal when the second bit of the two-bit key is set to a one state.

Matching I/O Storage Keys

Figure 6:
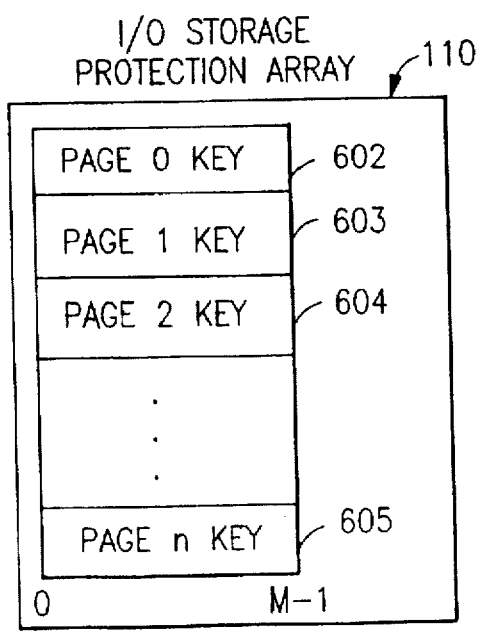
FIG. 6 shows schematically the I/O protection array in FIGS. 1, 2 and 3 in which each key is comprised of m-1 bits.

The operation of the I/O protection array 110 can be further enhanced by providing a matching field in each I/O storage key in the I/O protection array shown in FIG. 6, where each key 602–605 is comprised of m-bits. A matching key may, or may not, contain the one-bit or two-bit key value previously described, but must contain a matching field for obtaining a match type of key protection for preventing and enabling I/O channel program accesses by non-privileged I/O programs, such as to restrict accessing only I/O buffers having a matching storage key.

Figure 21:
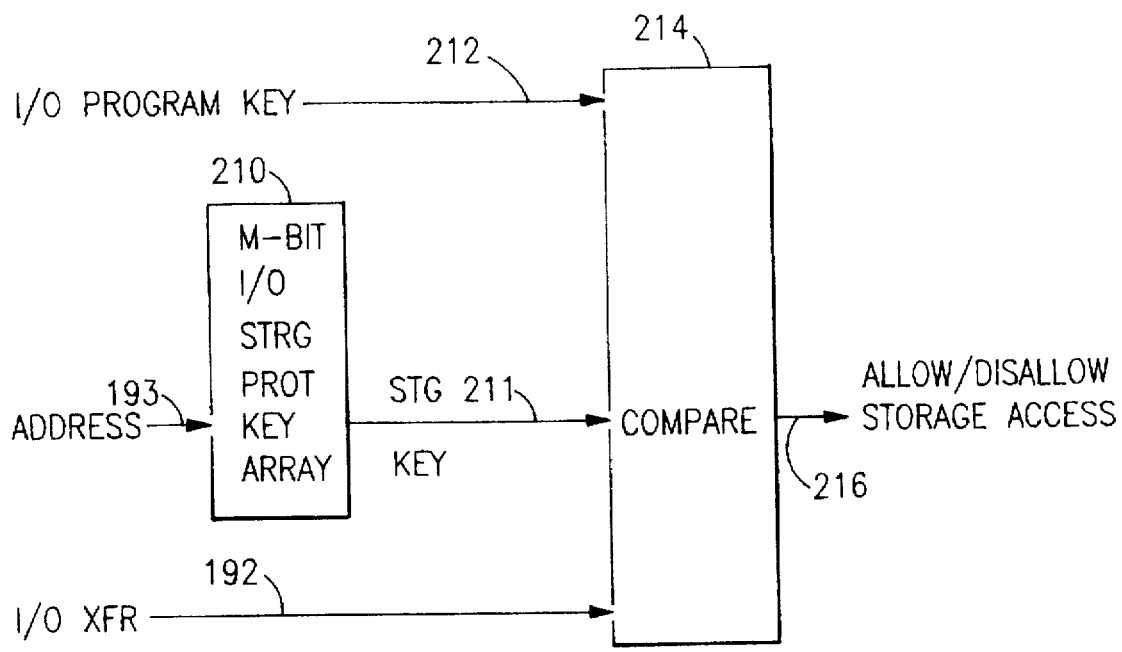
FIG. 21 shows hardware logic usable with matching I/O program keys and I/O storage keys.

FIG. 21 represents hardware logic circuits that control allowance or disallowance of a storage access for a request by an I/O program for fetching or storing memory data protected by an M-bit matching type of I/O storage key array 210. Storage key array 210 contains M-bit storage keys selected by an address on bus 193 which locates the required two-bit I/O storage key in array 210 and outputs the M-bit key on signal line 211 to AND gate 214. I/O transfer signal line 192 and address bus 193 are included as inputs to a compare circuit 214 which compares the M-bit storage key on lines 211 with an M-bit I/O program key provided on lines 212. Gate 214 generates a disallowance output signal for an I/O transfer signal on line 192 when the two keys mismatch in compare circuit 214.

Combined I/O Storage Keys

Figure 22:
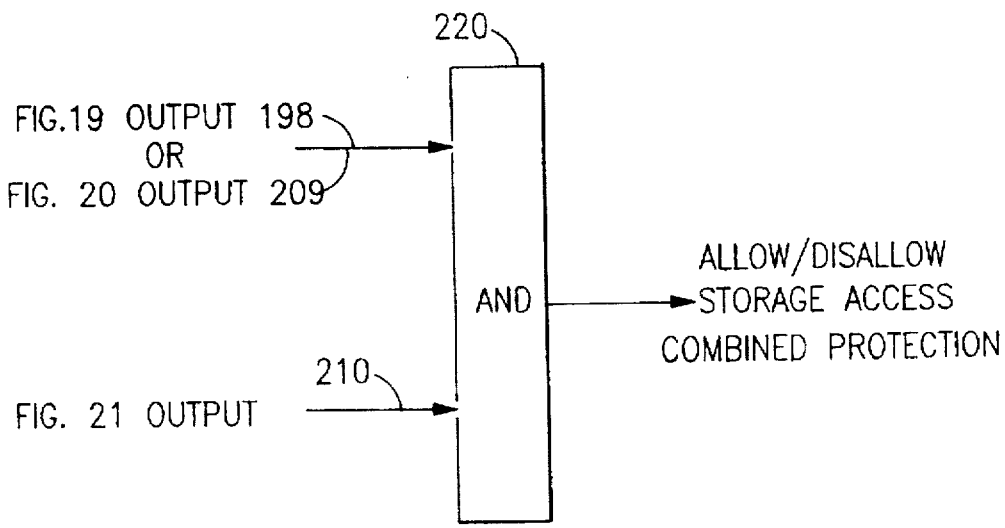
FIG. 22 shows hardware logic for use with combined matching and non-matching I/O program keys and I/O storage keys.

The one-bit key I/O protection array 196 in FIG. 19 can be further enhanced by combining each of its one-bit keys with an associated M-bit key of the storage protection array 210 in FIG. 21 to structure a single array containing combined I/O storage keys. Likewise, the two-bit key I/O protection array 204 in FIG. 20 can be further enhanced by combining each of its two-bit keys with an associated M-bit key of the storage protection array 210 in FIG. 21 to structure a single array containing combined I/O storage keys. FIG. 22 shows a logic circuit for generating an allow/disallow storage access signal from such combined I/O storage keys for controlling storage accesses of I/O program requests.

Figure 4A:
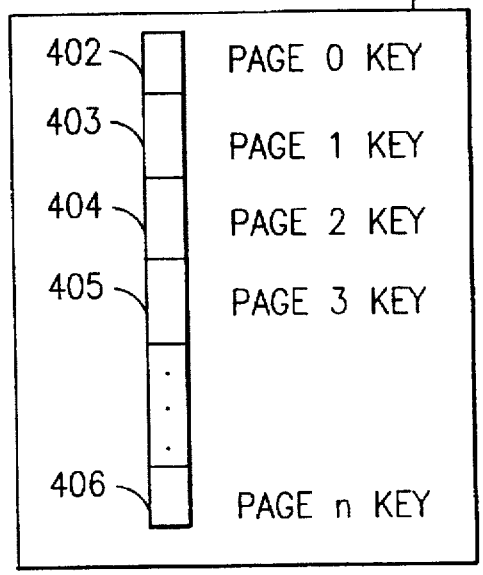

The circuit in FIG. 22 comprises an AND gate 220 which receives output signals from other circuits of the type described for FIG. 19 or 20 and FIG. 21. Each combined storage key has a part containing a one-bit storage key (as shown in FIG. 4A and used in FIG. 19) or a two-bit storage key (as shown in FIG. 5 and used in FIG. 20) concatenated with another part containing an M-bit storage key of the type shown in FIG. 6 and used in FIG. 21.

A matching storage key may, or may not, be combined with the one-bit or two-bit storage key, for obtaining key protection for preventing and enabling I/O channel program accesses by non-privileged I/O programs, such as to restrict accessing only I/O buffers having a matching storage key. The combining is a design choice which may improve the overall storage protection in some cases.

Each M-bit key may have two subfields: one subfield may have two bits operating as defined in FIG. 15, and another subfield may have m–2 bits operating as a matchable subfield. FIG. 9 represents key-matching logic for the matchable subfields, which are in both the I/O program key and the I/O storage protection key. The logic involves the result of a comparison between the contents of these subfields, and has rules for ignoring the results of the comparison in special cases. The first subfield of the I/O storage protection key contains a two bit input/output control field as defined in FIG. 15. However, the first subfield (two bits) of the I/O program key is ignored in the comparison logic and in FIG. 9. Hence, the description of FIG. 9 is referring only to the matchable subfield of the key, and refers to it as "the key".

In FIG. 9, the first column 901 contains all possible values for the matchable subfield of any I/O program key. The second column 902 shows all possible values for the matchable subfield in any I/O storage protection key, which are being compared, which is compared with a matchable subfield in column 901. The third column 903 shows whether an I/O access is allowed by the matching logic, where yes indicates an I/O access is to be allowed, and a no indicates no access is allowed.

The matching logic in FIG. 9 cannot override a "not-in-use" indication for the associated I/O buffer in the IOBT, which does not access allow an access—regardless of whether either key has a zero matchable value.

A special case is represented by row 904 in the logic table of FIG. 9 for a zero I/O storage protection key. A zero I/O storage protection key prevents all access to the associated I/O buffer by all programs, whether supervisory or non-supervisory. However, a supervisory program can change the key in array 110, and any field in any IOBT, to any value required, so the supervisory control program can do whenever key and field changes are necessary to access any I/O buffer.

In the key-matching logic of FIG. 9, another special case 905 exists for a zero I/O program key. The zero I/O program key is reserved for the exclusive use of I/O accesses for the system control program. If a zero value is assigned to the I/O program matchable subfield, access is allowed regardless of the value of the I/O storage array key, and hence regardless of whether a match or mismatch occurs between the keys, as long as the input/output control bits are non-zero in the other subfield of the key. However, if a key's input/output control subfield is zero (00), then no access is allowed (because no input or output is allowed), even if the key's matchable subfield has a zero value and matches.

Case 906 is the ordinary case for non-supervisory programs, such as application programs, which requires a match between the compared keys for access to be allowed.

Storage Key Management Table

FIG. 14 shows an enhanced version of I/O buffer table 1001 having key value fields 1401. Each field 1401 contains the key value assigned to the I/O buffer addressed from field 1002 in the same row (IOBTE 1005) in the table. The key value in field 1401 is assigned to each block (page frame) in the respective I/O buffer (which is done when loading the key values from table 1001 into the I/O storage key array 110 when initializing the system).

Each field 1401 contains at least one storage key, and field 1401 may contain two storage key values. If field 1401 contains a single key, it may be any of a one-bit key, two-bit key, or an M-bit key. But if field 1401 contains two keys, one of the keys may be an M-bit key and the other of the keys may be a one-bit key or a two-bit key; and both are loaded into the I/O storage key array.

Thus in FIG. 14, each entry (IOBTE) 1005 has the three fields shown in FIG. 10 in addition to I/O key field 1401. The IOBT structure in FIG. 14 supports an added SCP management function due to field 1401, and this function allows the SCP to more easily manage the I/O storage key values by having them together in the IOB table. The SCP inserts the key values into fields 1401, from which the SCP can load these key values into I/O key array 110. Fields 1401 may contain the value for any type of key, including types of keys which indicate a direction-of-use restriction for the associated buffer, such as input-only, output-only, or input/output.

Further, the buffer value fields 1401 in the IOB table 1001 in FIG. 14 may be used to apportion the main storage page frames into separate I/O buffers and the page frames in each I/O buffer have the same I/O key value in field 1401 in the same row.

Figure 16:
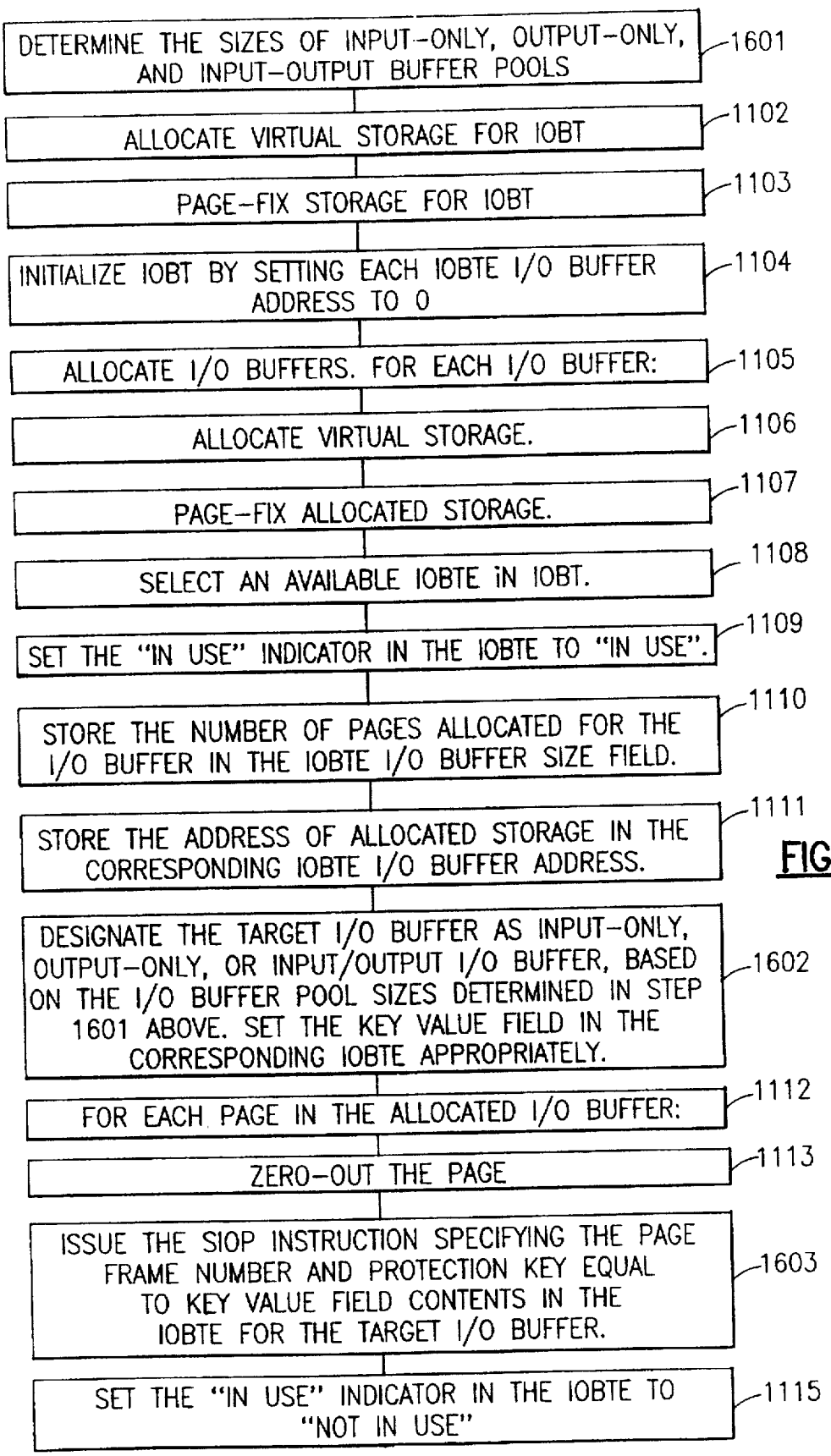
FIG. 16 shows a I/O buffer allocation process during system initialization where buffer types (input-only, output-only, or input/output) are designated.

SCP processes are disclosed that initialize, manage, add, and remove I/O buffers by using the IOBT 1001. FIG. 16 is a flow diagram of system initialization processes previously described herein and enhanced to allocate I/O buffers in groups using data-movement direction indicators in the IOBT key value fields 1401, e.g. store only, fetch only, and store and fetch using two-bit keys.

The FIG. 16 process may also support M-bit storage key values (compare keys) in the IOBTEs. Further, the FIG. 16 process may also support two keys per IOBTE, in which one key may be an M-bit storage key (compare key) and the other key may be a one-bit or two bit storage key (non-compare key). Therefore, the FIG. 16 process is similar to the process shown in FIG. 11, and uses steps similar to steps 1101 through 1115 of the latter process for creating required I/O buffers and storing contents in the associated IOBTE fields as represented in FIG. 14.

FIG. 16 likewise uses a predetermined I/O buffer size indicator 1003 for each of plural types of buffers which may be used, such as input-only buffers, output-only buffers, and input/output buffers. Each size indicator indicates the number of pages in the respective I/O buffer.

In the FIG. 16 process, step 1601 determines the pool-size indicators to be used as the respective sizes for each of the different I/O buffer types, which is the number of consecutive pages in each of: input-only, output-only, and input/output types of I/O buffers. Steps 1102 through 1111 are executed as previously explained for FIG. 11, but after step 1601.

Step 1602 determines the size value for field 1003 of a particular I/O buffer being setup, and uses the buffer type indicated in an associated two-bit key in field 1401 to select the size for that type previously determined by step 1601. Steps 1112 and 1113 are executed to zero out the page frames in the associated I/O buffer, after step 1602.

Step 1603 decrements a count starting with a value equal to the pool-size indicator selected for the particular table entry (IOBTE). Then step 1603 issues the SIOP instruction for each page frame in the I/O buffer to load the I/O key value for that I/O buffer from field 1401 into a corresponding key location in the I/O key array 110.

Finally, step 1115 sets the IOBTE in-use indicator field 1004 to the not-in-use state for each IOBTE. The process in FIG. 16 ends when all IOBTEs have been processed in the table.

Figure 17:
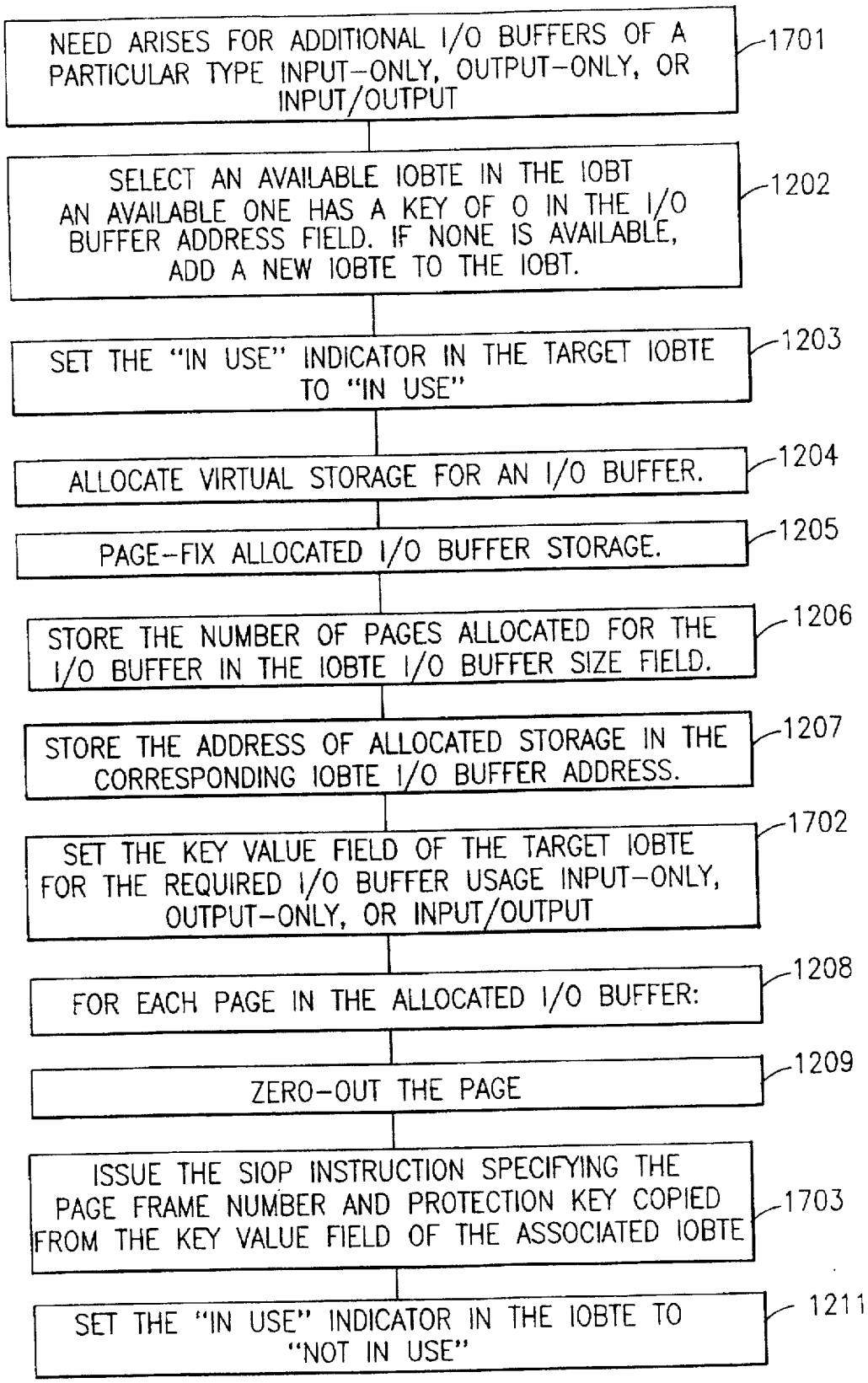
FIG. 17 shows a process for addition of I/O buffers for the environment where the buffer types (input-only, output-only, or input/output) are designated.

FIG. 17 shows a variation of the I/O buffer process of FIG. 12, but supports adding, after initialization, another I/O buffer (having a requested buffer type) to the data processing system by adding it as another entry in the IOBT. Step 1701 receives a signal indicating the need for an addition I/O buffer of a specific type (input-only, output-only, or input and output). The process in FIG. 17 is similar to the process depicted in FIG. 12, and operates after the process in FIG. 16 has been completed. Steps 1202 though 1207, steps 1208 and 1209 are described herein for FIG. 12. Step 1702 and step 1703 operate like steps 1602 and 1603, respectively, described for FIG. 16 to set the IOBTE key value and size fields, and to execute an SIOP instruction to load the I/O array 110 with that key value.

Figure 18:
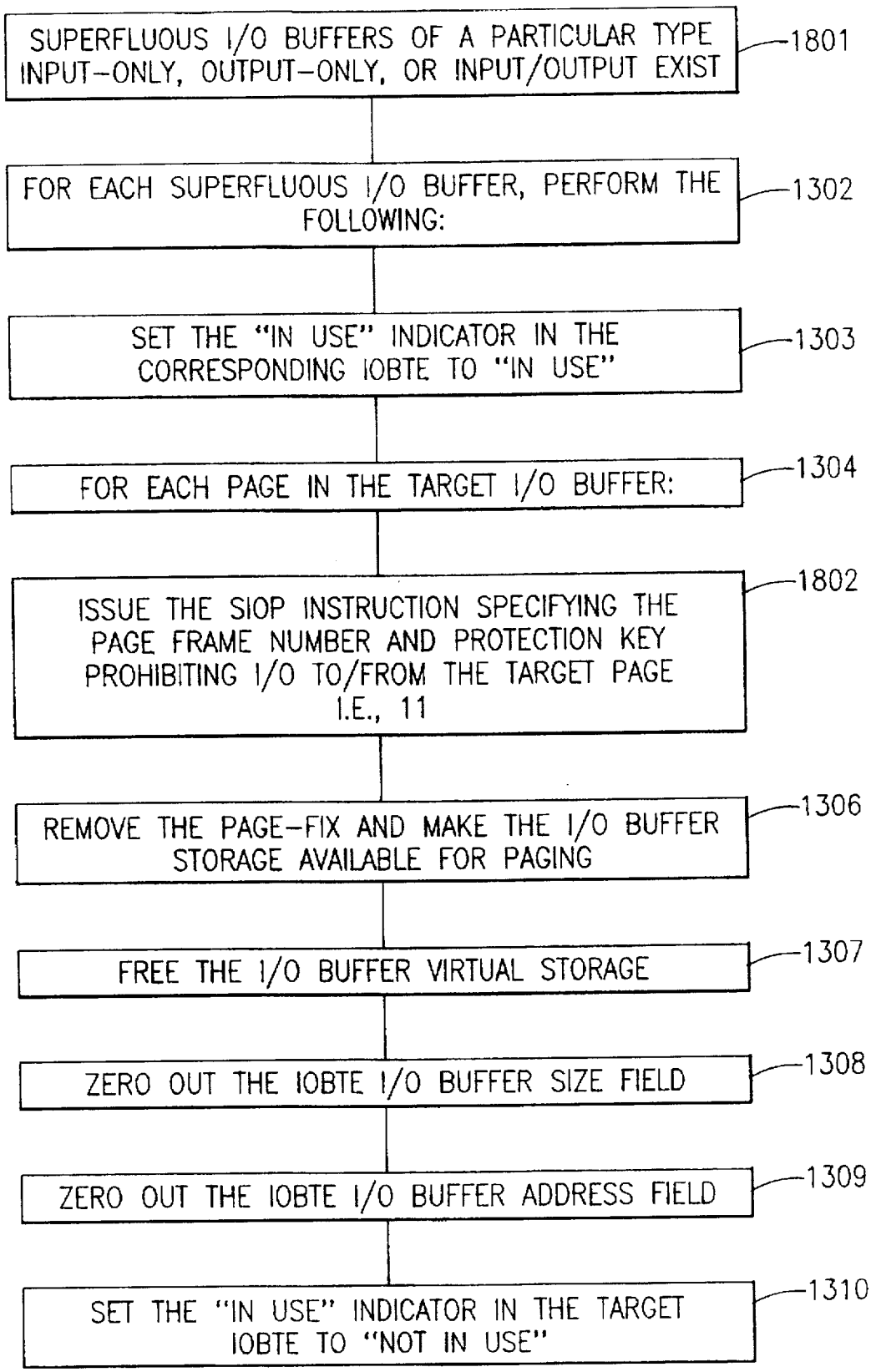
FIG. 18 shows a process for removal of I/O buffers of a specific type (input-only, output-only, or input/output).

FIG. 18 shows a process for removing an I/O buffer of a designated type, similar to the buffer removal process of FIG. 13, except that FIG. 18 allows for the removal of a superfluous I/O buffer of a particular type (input-only, output-only, or input and output). Step 1801 receives a request for the removal of a designated I/O buffer. Steps 1302 through 1304, and steps 1306 through 1310 are as described for the process in FIG. 13. Then, step 1802 writes an all-zeros key value (which indicate an unusable I/O protected buffer type), and then issues a SIOP instruction in which its R2 operand contains the all zeros key value in the field 1401 of the entry to make it impossible to perform any I/O input to, or I/O output from, the target (associated) I/O buffer, thus removing that I/O buffer and its entry content from the IOBT, making that IOBTE available for future use.

In any IOBT entry, the in-use field is examined first, and all other fields in the entry are ignored if the 0 in-use value exists in the entry, indicating that the buffer is not-in-use. Thus, any I/O access in the associated buffer requires a 1 in-use value.

Next, the buffer key field is examined; and if it has a 00 disabling buffer-type value (no input and no output), the buffer cannot be used for any I/O access. Thus, an I/O access in the associated buffer requires an enabling (non-zero) buffer type key value. But even for non-zero values, the buffer-type key value may indicate the direction of data movement to/from the buffer; and if the direction of data movement does not correspond, no I/O access is allowed. For example, if a fetch is requested for a buffer indicated as a store-only buffer, the access is not allowed. Or if a store is requested for a buffer indicated as a fetch-only buffer, the access is not allowed. That is, fetches are only allowed in buffers indicated to be either fetch-only or a fetch and store, and stores are only allowed in buffers indicated to be either store-only or a fetch and store.

Further, any matching type of I/O storage key is examined, and the associated buffer can only be used for an I/O access if the I/O program requesting the current access into the associated buffer has an I/O program key that matches the I/O storage key in the array key assigned to the associated I/O buffer. This key-matching logic for M-bit keys is represented in the I/O storage key array in FIG. 9, in which each key entry contains a value comprised of two keys—which are a two-bit non-matching key and an M-bit matching key.

The handling of the I/O program key involves passing it to the channel subsystem 104 in the conventional manner, along with the other relevant parameters needed to initiate an I/O channel program operation. In IBM S/390 systems, the I/O program key value is placed in the Operation Request Block which is passed to the channel subsystem 104 as a result of the execution of the Start Subchannel instruction.

When an M-bit I/O protection key is used, the SCP uses the I/O buffer management structure depicted in FIG. 14. The primary difference between the m-bit and the one and two bit key value arrays 110 is that the m-bit keys require matching with an I/O program key, and the one-bit and two-bit keys do not use matching with any I/O program key. The M-bit key may have any size compatible with the economics of the system.

Loading Instruction for Storage Key Arrays

Figure 7:
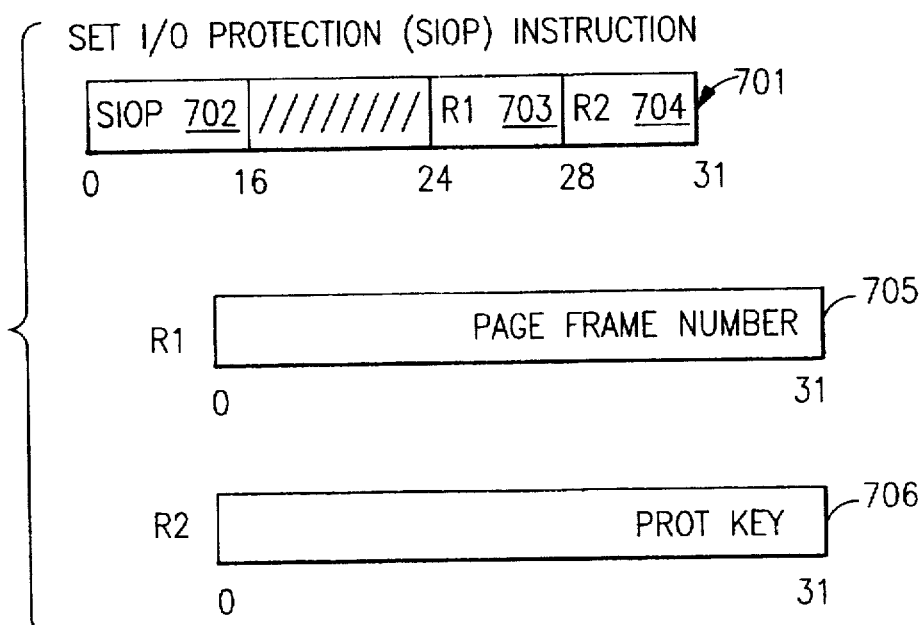
FIG. 7 shows schematically the format of a SET I/O PROTECTION (SIOP) instruction used with the preferred embodiment.

FIG. 7 shows the SET I/O PROTECTION (SIOP) instruction 701 which is used to load an I/O storage protection key value into the I/O storage protection key array 110. The R2 operand specifies the key value, and the R1 value specifies an index in array 110 at the location for the key in the array. R1 and R2 are general registers, but either or both of these instruction operands could have main storage location specifications. For one-bit keys, the R2 operand may be filled with a string of one-bit keys, and the R1 operand specifies the index in the array of the array location to receive the first of the one-bit keys in R2. A like method is used for loading two-bit keys, M-bit keys, or keys of any size.

The SCP assigns an I/O program key to each I/O program requesting an I/O data transfer between a requested device and main storage; the SCP designates to the I/O program the particular I/O buffer address in a row in IOBT 1001 of FIG. 14. Also, the SCP may pass the data between that I/O buffer and a requesting CPU program, or may pass the location of the I/O buffer to the requesting CPU program. An error in an access in an I/O buffer results in an I/O error exception.

CPU Versus I/O storage Protection

Figure 3:
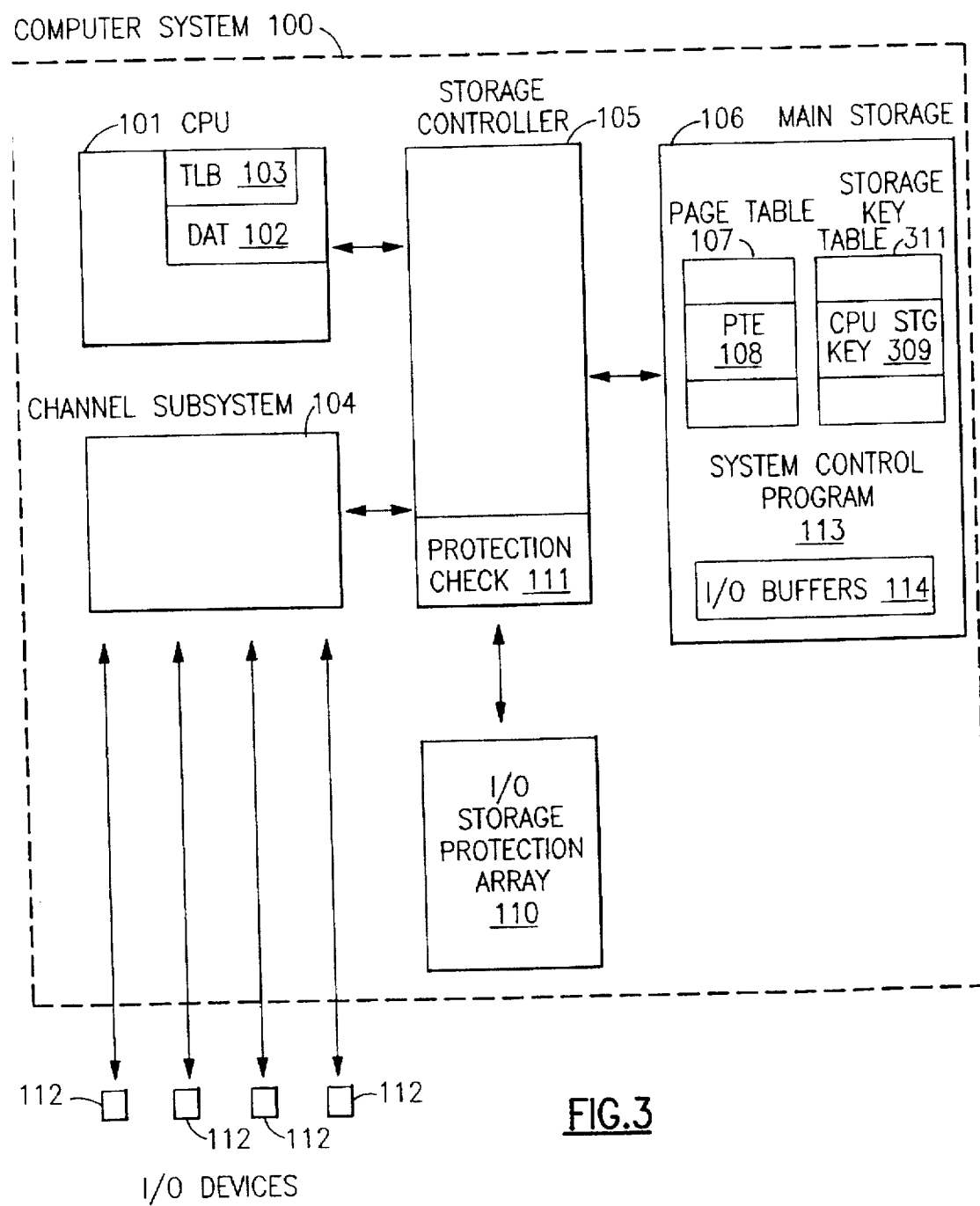
FIG. 3 shows the system of FIG. 1 with the addition of a page table with a storage-key subtable for associating virtual-storage-keys with page table entries for CPU programs using virtual addressing.

CPU storage protection is optional for use with the subject invention, because the invention may be used without CPU storage protection. However, a system with maximum protection will use CPU storage protection with I/O storage protection. The CPU storage protection may be provided with or without any CPU key array. The preferred embodiment in FIG. 3 provides CPU storage key protection without any CPU key array.

Figure 2:
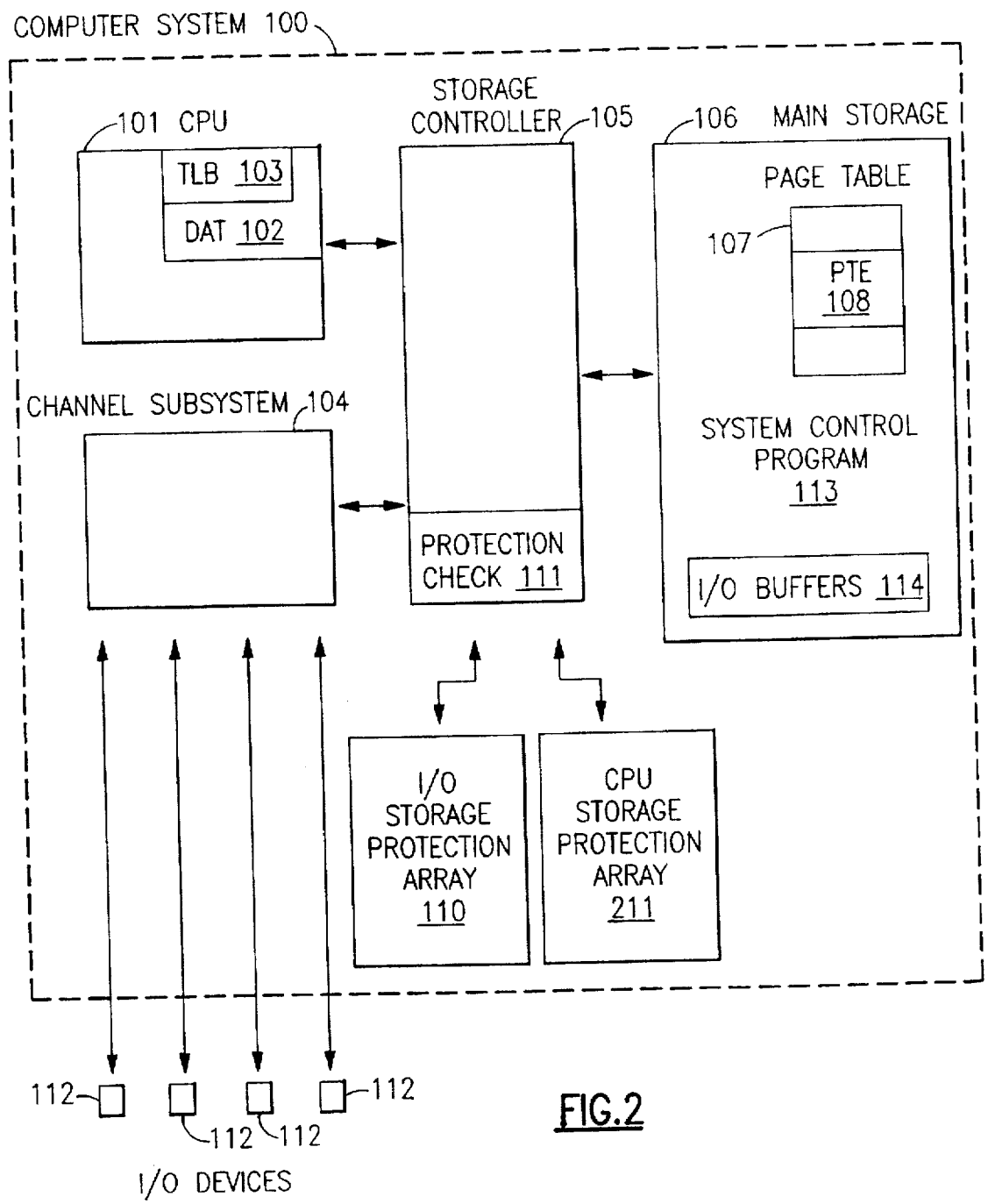
FIG. 2 shows the system of FIG. 1 with the addition of CPU storage-protection key array for containing real keys for use with CPU programs.

FIG. 2 represents a system having a CPU storage protection key array 211 with I/O storage protection key array 110. The CPU protection array protects real storage against unintended alteration by CPU programs. Both the CPU protection array 211 and the I/O protection array 110 operate with the protection-check facility 111 of storage controller 105 which checks CPU storage protection keys from the CPU protection array 211 separately from, and independent of, the checking of the I/O storage protection keys from the I/O protection array 110, because the logic rules governing the CPU keys is different from the logic rules governing use of the I/O keys.

Thus CPU keys in the CPU protection array 211 may also have any size such as one, two, or any number of bits to control accesses in a corresponding page frame of the main storage 106, and the size of the CPU keys is fundamentally independent of the size of the I/O keys, although in a particular system design they may be made the same to simplify logic circuits in check protection hardware/ microcode 111. The operation of such CPU storage protection arrays may follow the CPU key check rules well known in the art.

The detailed embodiments in FIGS. 1 and 2 provide hardware key protection for real storage page frames. A CPU key obtained from CPU array element 211 is used only for protecting page frames after any CPU virtual address translation is completed. Such CPU key protection is usable for protecting pages accessed by both real address and virtual addresses. Likewise, I/O keys obtained from I/O are usable for protecting pages accessed by both real address and virtual addresses, although the preferred embodiment assumes only real addressing is used for I/O operations.

The preferred embodiment represented in the system shown in FIG. 3 provides a unique combination of key protection—for protecting CPU virtual addressing and I/O real addressing, which only requires one hardware key array (i.e. the I/O key array).

FIG. 3 shows a system having the I/O storage protection features described for FIG. 1 with an addition of CPU virtual storage protection provided by CPU storage keys (CPUSKs) 309 found in page table entries (PTEs) 108 in a page table 107. FIG. 23 illustrates a PTE containing a CPUSK 309, flag bits, and a page frame real address (PFRA).

The PTEs in storage key table 311 are accessed for, and translated by, DAT 102 facility of the CPU 101 as part of a conventional virtual-address translation process. But included in the DAT process is the removal of the virtual CPU storage key 309 and sending it to the protection check 110 facility to check the CPUSK of an addressed page against a CPU program key of a program requesting an access in the addressed page. The protection provided by CPUSKs 309 only protects pages against unwanted alteration by CPU programs, and is separate from, and independent of, the protection provided by the I/O keys in I/O protection array 110, which only protects real page frames against accesses by I/O programs. That is, the CPUSKs 309 do not protect against unwanted storage alteration by I/O channel programs.

Multiple page tables are generally used in a system to map non-contiguous real storage page frames to a virtual memory. Further, segment tables (as conventionally used in the IBM S/390 architecture) may combine various page tables into multiple address spaces. And the PTEs in such tables may have the structure shown in FIG. 23.

It will be apparent to the skilled artisan that other embodiments of the present invention beyond the embodiments specifically described herein may be made or practiced without departing from the spirit of the invention described in this specification and defined in its claims. It will also will be clear to the skilled artisan that numerous equivalent elements may be substituted for elements expressly disclosed herein as a part of a functional limitation described or claimed. Similarly, changes, combinations and modifications of the presently disclosed embodiments will also become apparent. The embodiments disclosed and the details thereof are intended to teach the practice of the invention and are intended to be illustrative and not limiting. Accordingly, such apparent but undisclosed changes, combinations, and modifications are considered to be within the spirit and scope of the present invention.

Having thus described our invention, what we claim as new and desire to secure by Letters Patent is:

1. Program code recorded on a medium for transferring the program code to a computer processor for execution, the program code embodying a method of managing I/O buffers in a shared main storage of a data processing system, the method comprising the steps of:

structuring an I/O buffer table (IOTB) in the shared storage with an IOTB entry for each I/O buffer to be setup, storing in the IOTB entry for an associated I/O buffer: a size indicator to indicate a size for the I/O buffer, an address to a location of the I/O buffer in the shared main storage, and an I/O storage key for controlling accesses to the I/O buffer, setting an in-use indicator to an in-use state in the entry to lock each IOTB entry prior to setting up an associated I/O buffer for preventing interference with buffer setup, allocating in the shared main storage a number of blocks of storage indicated by the size indicator in the IOTB entry for each I/O buffer to be setup, and fixing the blocks of allocated storage for each I/O buffer to prevent paging out to I/O of any block in an I/O buffer, loading each I/O storage key from a respective entry in the IOBT into an I/O storage key array of a storage controller at locations corresponding to locations of blocks in an associated I/O buffer, and setting the in-use indicator in the respective entry to a not-in-use state to prevent use of a respective I/O buffer until the I/O buffer is assigned to a using program.

2. Program code recorded on a medium for supporting execution of a method of managing I/O buffers in a shared main storage of a data processing system as defined in claim 1, further comprising the step of:

deleting any information in the allocated blocks of storage when allocated to the I/O buffer.

3. Program code recorded on a medium for supporting execution of a method of managing I/O buffers in a shared main storage of a data processing system as defined in claim 1, further comprising the steps of:

selecting one of a plurality of size indicators for I/O buffers represented in IOTB entries, and writing a selected size as the size indicator in each IOTB entry for an associated I/O buffer.

4. Program code recorded on a medium for supporting execution of a method of managing I/O buffers in a shared main storage of a data processing system as defined in claim 1, further comprising the step of:

writing an I/O storage key value in each IOTB entry for each I/O buffer represented in the IOTB.

5. Program code recorded on a medium for supporting execution of a method of managing I/O buffers in a shared main storage of a data processing system as defined in claim 1, further comprising the step of:

protecting each I/O buffer by assigning a particular I/O key value in the IOTB entry associated with the I/O buffer.

6. Program code recorded on a medium for supporting execution of a method of managing I/O buffers in a shared main storage of a data processing system as defined in claim 5, further comprising the step of:

assigning an I/O key value indicating a direction of data movement in relation to an associated I/O buffer.

7. Program code recorded on a medium for supporting execution of a method of managing I/O buffers in a shared main storage of a data processing system as defined in claim 6, further comprising the step of:

assigning the direction of data movement for an associated I/O buffer as one of: input-only I/O buffer, output-only I/O buffer, input-and-output I/O buffer, and no-input-and-no-output I/O buffer.

8. Program code recorded on a medium for supporting execution of a method of managing I/O buffers in a shared main storage of a data processing system as defined in claim 1, further comprising the steps of:

inserting at a later time a new IOTB entry for supporting a new I/O buffer for use by the data processing system, setting an in-use indicator in the IOBT entry to an in-use state to lock an associated block for preventing interference with the setup, storing in the IOBT entry: a size indicator for indicating the number of blocks of storage for the new I/O buffer, an address to the location of the new I/O buffer in the main storage, and an I/O storage key for protecting the new I/O buffer represented by the entry, allocating storage for the new I/O buffer, and fixing allocated storage for the new I/O buffer in the shared main storage to prevent release of the allocated storage for the new I/O buffer, loading the I/O storage key for the new buffer into an I/O storage key array of a storage controller to control access to the new buffer, and setting the in-use indicator to a not-in-use state to prevent use of each I/O buffer until after the new I/O buffer is assigned to a using program.

9. Program code recorded on a medium for supporting execution of a method of managing I/O buffers in a shared main storage of a data processing system as defined in claim 1, further comprising the steps of:

allocating virtual storage for virtual blocks (pages) in a virtual storage for the system using each size indicator to indicate the number of contiguous pages allocated in the virtual storage for use by an associated virtual I/O buffer, storing in each IOBT entry: a virtual address to the associated virtual I/O buffer comprised of the number of contiguous pages allocated to each virtual I/O buffer, translating each virtual address to a page frame real address (PFRA) to be accessed in any virtual I/O buffer in the main storage, and obtaining an I/O storage key associated with the I/O buffer to protect each page frame used by the virtual I/O buffer.

10. Program code recorded on a medium for supporting execution of a method of managing I/O buffers in a shared main storage of a data processing system as defined in claim 1, further comprising the steps of:

structuring an I/O storage key array containing an I/O storage key entry for each block of storage in the shared main storage, locating each I/O storage key entry in the array at an index associated with the address of the block in the shared main storage, and storing an I/O storage key in each I/O storage key entry at the index associated with the I/O buffer addressed in the the IOTB entry, executing an I/O program to generate a block address to a block in the shared main storage, using the block address to generate an index in the I/O storage array for obtaining the I/O storage key for the associated block, and accessing the associated block by the I/O program if the obtained I/O storage key has a state indicating access is allowed to the block by an I/O program.

11. Program code recorded on a medium for supporting execution of a method of managing I/O buffers in a shared main storage of a data processing system as defined in claim 10, further comprising the step of:

accessing a block in an I/O buffer by the I/O program only if the access has a direction of data movement allowed by the I/O storage key.

12. Program code recorded on a medium for supporting execution of a method of managing I/O buffers in a shared main storage of a data processing system as defined in claim 10, further comprising the step of:

loading by a privileged instruction the I/O storage keys from the IOTB to the I/O storage key array for controlling accesses to the I/O buffers.

13. Program code recorded on a medium for supporting execution of a method of managing I/O buffers in a shared main storage of a data processing system as defined in claim 10, further comprising the steps of:

setting by a privileged instruction of the I/O program key for any I/O program to one of plural key code values providing an I/O access-enabling state.

14. Program code recorded on a medium for supporting execution of a method of managing I/O buffers in a shared main storage of a data processing system as defined in claim 10, the CP entity further comprising the steps of:

storing at least one page table (PT) in the computer system, the PT containing a plurality of PT entries (PTEs), each PTE having at least a page frame real address (PFRA) and a CP storage key field for containing a CP storage key for controlling access to the block in the shared main storage addressed by the PFRA in the same entry, accesses by I/O programs to the blocks (page frames) in the shared main storage not being controlled by the CP storage keys, and protecting all accesses to each block (page frame) in the shared main storage with two separate storage keys, which are an I/O storage key in a hardware array and a CP virtual storage key contained in the CP storage key field in a page table entry (PTE) having a real address to the block.

15. Program code recorded on a medium for supporting execution of a method of managing I/O buffers in a shared main storage of a data processing system as defined in claim 14, the CP entity further comprising the steps of:

one or more CP units (CPUs) concurrently executing one or more CP programs, each CPU having an assigned CP program key to control access to the main storage blocks by a program executing on the CPU, and setting an I/O storage key to the block to allow I/O access by an I/O program to a storage block, and setting the CP storage key for the block to allow CP access concurrently.

16. Program code recorded on a medium for supporting execution of a method of managing I/O buffers in a shared main storage of a data processing system as defined in claim 15, the CP entity further comprising the steps of:

a privileged instruction for setting the I/O storage key for any block in the shared main storage to any code value provided for the I/O storage keys for the blocks.

17. Program code recorded on a medium for supporting execution of a method of managing I/O buffers in a shared main storage of a data processing system as defined in claim 1, further comprising the step of:

executing a plurality of I/O programs concurrently by a plurality of I/O processors, assigning an I/O program key to each I/O program which may be the same as, or different from, an I/O program key assigned to other I/O program.

18. Program code recorded on a medium for supporting execution of a method of managing I/O buffers in a shared main storage of a data processing system as defined in claim 1, further comprising the steps of:

providing an I/O state for an I/O program while the program is executing, comparing an I/O program key assigned to an executing I/O program with an I/O storage key found in an I/O storage key array for a storage block being accessed by the executing I/O program, and allowing an access to the storage block by the I/O program only if an I/O state exists for the I/O program and the I/O program key is equal to I/O storage key.

19. Program code recorded on a medium for supporting execution of a method of managing I/O buffers in a shared main storage of a data processing system as defined in claim 1, further comprising the step of:

allowing access to the block when an I/O program key mismatches with an I/O storage key for a block for specified exceptions to a matching condition provided for the comparing step.

20. Program code recorded on a medium for supporting execution of a method of managing I/O buffers in a shared main storage of a data processing system as defined in claim 1, further comprising the step of:

structuring a central processor (CP) storage key array with a plurality of CP storage key entries respectively associated with the plurality of blocks in the shared main storage for protecting the associated blocks from being inadvertently changed by unauthorized CP programs, but no protection from I/O access being provided by the CP storage keys for the plurality of blocks.

21. Program code recorded on a medium for supporting execution of a method of managing I/O buffers in a shared main storage of a data processing system as defined in claim 1, the CP entity further comprising the steps of:

executing a plurality of CP instruction streams assigned CP program keys which may be the same as I/O storage keys without any conflict existing between the I/O and CP storage keys, providing a plurality of CP storage key entries respectively associated with the plurality of blocks in the shared main storage for protecting the associated blocks from being inadvertently changed by unauthorized CP programs, but no protection from I/O access being provided by the CP storage keys for the plurality of blocks, setting a CP storage key in a CP storage key entry to either a CP access-enabled state or to a CP access-disabled state for enabling or preventing access to associated blocks by the CP processor entity, and each CP storage key entry having no control over any access to the associated blocks by any I/O processor entity, and controlling all accesses to each block in the main storage by two storage keys comprised of an I/O storage key and a CP storage key.

* * * * *